(12) United States Patent
Coombs et al.

(10) Patent No.: US 7,185,260 B2
(45) Date of Patent: Feb. 27, 2007

(54) METHOD AND APPARATUS FOR IMPLEMENTING A DATA PROCESSOR ADAPTED FOR TURBO DECODING

(75) Inventors: Robert Coombs, Wokingham (GB);
Jonathan Talbot, Pewsey (GB);
Alexander Worm, Brussels (BE)

(73) Assignee: ARC International, Elstree (GB)

( * ) Notice: Subject to any disclaimer, the term of this patent is extended or adjusted under 35 U.S.C. 154(b) by 334 days.

(21) Appl. No.: 10/818,735

(22) Filed: Apr. 5, 2004

(65) Prior Publication Data

US 2004/0225949 A1 Nov. 11, 2004

Related U.S. Application Data

(63) Continuation of application No. 10/165,146, filed on Jun. 5, 2002, now Pat. No. 6,718,504.

(51) Int. Cl.
*H03M 13/39* (2006.01)
*H03M 13/41* (2006.01)

(52) U.S. Cl. ................................. 714/755; 714/792

(58) Field of Classification Search ............... 714/755, 714/792
See application file for complete search history.

(56) References Cited

U.S. PATENT DOCUMENTS

| | | | |
|---|---|---|---|
| 3,652,998 A | 3/1972 | Forney, Jr. | |
| 4,677,625 A | 6/1987 | Betts et al. | |
| 4,677,626 A | 6/1987 | Betts et al. | |
| 4,802,174 A | 1/1989 | Hiraiwa et al. | |
| 4,881,241 A | 11/1989 | Pommier et al. | |
| 5,077,741 A | 12/1991 | Kotzin | |
| 5,157,671 A | 10/1992 | Karplus | |
| 5,263,051 A | 11/1993 | Eyuboglu | |
| 5,287,374 A | 2/1994 | Parr | |
| 5,289,501 A | 2/1994 | Seshadri et al. | |
| 5,331,664 A | 7/1994 | Desperben et al. | |
| 5,442,627 A | 8/1995 | Viterbi et al. | |

(Continued)

FOREIGN PATENT DOCUMENTS

EP    0 409 205 A2    7/1990

(Continued)

OTHER PUBLICATIONS

Bonek, P.; Ivanov, A.; Kallel, S., "A variable rate constraint length K=5 Viterbi decoder for 12 Mb/s ," Electrical and Computer Engineering, 1993. Canadian Conference on , vol., No.pp. 582-585 vol. 1, Sep. 14-17, 1993.*

(Continued)

*Primary Examiner*—R. Stephen Dildine
(74) *Attorney, Agent, or Firm*—Gazdzinski & Associates

(57) ABSTRACT

An improved method and apparatus for performing single-cycle operations (such as for example Maximum a Posteriori, i.e. MAP decode) in digital processors is disclosed. In one exemplary configuration, a processor is fitted with a specialized instruction and extension Arithmetic Logic Unit (ALU) to efficiently perform the forward and reverse transition trellis metric updates as well as the Log Likelihood ratio calculation in order to accelerate the decoding of Turbo-encoded data sequences. The processor executes software comprising the single operand instruction to perform Turbo decoding with the efficiency comparable to a dedicated hardware implementation. The programmable apparatus can be readily reprogrammed to accommodate evolving standards.

43 Claims, 15 Drawing Sheets

U.S. PATENT DOCUMENTS

| | | | |
|---|---|---|---|
| 5,446,747 | A | 8/1995 | Berrou |
| 6,028,899 | A | 2/2000 | Petersen |
| 6,192,501 | B1 | 2/2001 | Hladik et al. |
| 6,272,183 | B1 | 8/2001 | Berens et al. |
| 6,289,000 | B1 | 9/2001 | Yonge, III |
| 6,304,996 | B1 | 10/2001 | Van Stralen et al. |
| 6,477,679 | B1 | 11/2002 | Such et al. |
| 6,516,437 | B1 | 2/2003 | Van Stralen et al. |
| 2003/0002603 | A1 | 1/2003 | Worm et al. |
| 2003/0028844 | A1 | 2/2003 | Coombs |

FOREIGN PATENT DOCUMENTS

| | | |
|---|---|---|
| EP | 1 271 789 A1 | 6/2001 |
| EP | 1 276 242 A1 | 7/2001 |
| JP | 59019454 | 1/1984 |
| WO | WO 00/27085 | 5/2000 |
| WO | WO 00/38366 | 6/2000 |

OTHER PUBLICATIONS

Report entitled "Modeling and Simulation of a Turbo Encoder and Decoder for Wireless Communication Systems" by Sayantan Choudhury (no date) (10 pages).

Article entitled "The UMTS Turbo Code and an Efficient Decoder Implementation Suitable for Software-Defined Radios" by M.C. Valenti and J. Sun; International Journal of Wireless Information Networks, vol. 8, No. 4, Oct. 2001 (© 2002) (pp. 203-215).

Article entitled "Turbo Code Implementation on the c6x" by William J. Ebel, Associate Professor, Alexandria Research Institute, Virginia Polytechnic Institute and State University (no date) (13 pages).

3DSP White Paper entitled Implementation of a 3GPP Turbo Decoder on a Programmable DSP Core by James G. Harrison, 3DSP Corporation as presented at the Communications Design Conference, San Jose, CA Oct. 2, 2001 (9 pages) (www.3dsp.com).

Report entitled Efficient Software Implementation of the Max-Log-MAP Turbo Decoder on the StarCore SC140 DSP by Amir Chass, Arik Gubeskys and Gideon Kutz, Motorola Semiconductor Israel Ltd. (no date) (5 pages).

Report entitled "A Real-Time Embedded Software Implementation of a Turbo Encoder and Soft Output Viterbi Algorithm Based Turbo Decoder" by M. Farooq Sabir, Rashmi Tripathi, Brian L. Evans, and Alan C. Bovik, Dept. of Electrical and Comp. Eng., The University of Texas, Austin, TX (no date) (5 pages).

Report entitled "Fixed Point Implementation for Turbo Codes" by Tri Ngo and Ingrid Verbauwhede, Department of Electrical Engineering, University of California, Los Angeles, Final Report 1998-99 for Micro Project 98-162 (4 pages).

Report entitled Reconfigurable Signal Processor for Channel Coding and Decoding in Low SNR Wirelss Communications by Steve Halter, Mats Oberg, Paul M. Chau and Paul H. Siegel, ICAS Center, University of California, San Diego, Center for Wireless Communications, (no date) (17 pages).

Report entitled "A Low Complex Parallel Decoding Structure for Turbo-Codes" by Zhang Zhongpei and Zhou Liang, 12th Dept. of UESTC, Chengdu 610054 China (no date) (3 pages).

Report entitled The Alcatel 9343 DVB-OBP Product: An On-Board Processor for Digital Television and Internet Data by Y. LeRoy, J. Prat, A. Jalon, J. Riba, J. Sala, and I. Morrison, Alcatel Espacio (AEO) (no date) (8 pages).

Report entitled "Turbo Codes propel new concepts for superior codes (Part III)" by Charles Constatine Gumas, (no date) (10 pages). (http://www.chipcenter.com/dsp/DSP000505F1.html).

\* cited by examiner

Note: Four butterflies are used in this constraint length three (K=4) encoding scheme

| abs(alu0-alu1) | 0 | 0.25 | 0.5 | 0.75 | 1 | 1.25 | 1.5 | 1.75 | 2 | >2 |
|---|---|---|---|---|---|---|---|---|---|---|
| correction | 0.75 | 0.50 | 0.50 | 0.50 | 0.25 | 0.25 | 0.25 | 0.25 | 0.25 | 0 |

FIG. 8b

Note: Special write mode writes 2 x 16 bit values, one to X and one to Y.

Note: Special write mode writes 2 x 16 bit values, one to X and one to Y.

```
/* Code fragment showing use of tqacs in forward recursion */ n = block_size-1;
  do
    {
      _core_write (tqacs (_core_read (x1_u), GAMMA_SELECT0), x0_u);
      _core_write (tqacs (_core_read (x1_u), GAMMA_SELECT1), x0_u);
      _core_write (tqacs (_core_read (y1_u), GAMMA_SELECT2), x0_u);
      _core_write (tqacs (_core_read (y1_u), GAMMA_SELECT3 |
GAMMA_COUNTER_INC), x0_u);
    }
  while (n--);
```

FIG. 14a

METHOD AND APPARATUS FOR IMPLEMENTING A DATA PROCESSOR ADAPTED FOR TURBO DECODING

This application is a continuation of and claims priority to co-owned U.S. application Ser. No. 10/165,146 filed Jun. 5, 2002 of the same title, now U.S. Pat. No. 6,718,504, which is incorporated herein by reference in its entirety.

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

This invention relates generally to data processing, and more particularly to the processing of algorithms in software that benefit from the efficient implementation of forward and backward butterfly operations used, for example, in Maximum a posteriori (MAP) decoding. Such exemplary MAP decoding is used in the processing of parallel concatenated codes (Turbo codes) and serial concatenated codes.

2. Description of Related Technology

Parallel and serial concatenated codes are formed from a data sequence that is concatenated with a sequence of output bits from two or more constituent encoders, e.g., convolutional encoders. Turbo codes correspond a specific type of parallel concatenated code. However, within this application, it is to be understood that where applicable, discussions referring to "Turbo codes" can be extended more generally to both parallel and serial concatenated codes. Embodiments involving parallel concatenated codes and more specifically Turbo codes are developed herein by way of example only.

The use of Turbo codes for transmission of data over a noisy channel was first introduced in C. Berrou, A. Glavieux, and P. Thitimajshima, "*Near Shannon limit error-correcting coding and decoding: Turbo codes*", Proc. of 1993 Int. Conf. Comm., pp. 1064–1070. This reference is referred to as the "Berrou reference" hereinafter. Turbo codes provide bit error rates near Shannon's theoretical limit but add significant complexity to the receiver's decoder. Turbo codes are used for forward error correction in several important communication standards such as, inter alia, third-generation partnership project (hereafter, 3GPP) cellular communications standards. Consequently much effort has been applied to develop efficient Turbo decoder implementations.

MAP (maximum a posteriori) based decoders are widely used within Turbo decoder implementations and require significant data processing. A MAP decoder determines a sequence that minimizes a symbol error rate as opposed to finding a maximum-likelihood sequence as determined using the more common Viterbi algorithm. The MAP decoder algorithm is described in Bahl, L. R. et al., "*Optimal Decoding of Linear Codes for Minimizing Symbol Error Rate,*" IEEE Transactions on Information Theory, March 1974, pp. 284–287, hereinafter called the "Bahl reference." The MAP decoder described in the Bahl reference is often called the "BCJR algorithm" in recognition of its authors. While the MAP decoder is more costly than the Viterbi algorithm, it provides an information sequence known as an extrinsic sequence that is needed by Turbo decoders. Two MAP decoders configured in a feedback configuration are employed within a Turbo decoder. The processing associated with MAP decoders accounts for the bulk of the computational load in Turbo decoding.

Most practical implementations perform computations using logarithmic representations of probability information and are known as Log-MAP decoders. A decoder known as the Max-Log-MAP decoder uses a mathematical approximation to simplify the calculations involved and to thereby reduce the overall complexity of the decoder. Max-Log-MAP decoders are discussed in "*Efficient Software Implementation of the Max-Log-MAP Turbo decoder on the StarCore SC140 DSP*", A. Chass, A. Gubeskys, and G. Kutz, ICSPAT 2000 and Motorola Application Note, hereinafter referred to as the "Chass reference." The Max-Log-MAP decoder performance is slightly reduced compared to the Log-MAP but is more commonly implemented due its decreased computational complexity. The Max-Log-MAP decoder performance can be improved by the addition of a correction term. A Max-Log-MAP decoder that makes use of this correction is known as a Max*-Log-MAP decoder. Max*-Log-MAP decoders are discussed in Michel, H. and When, N. "*Turbo-Decoder Quantization for UMTS*" IEEE Communications letters, Vol. 5, Number 2, February 2001, hereinafter called the Michel reference. The exemplary embodiment of the invention performs efficient Max*-Log-MAP decoding in software using of a customized processor designed to efficiently implement operations involved in various MAP decoding algorithms. Most of the computational operations required to perform MAP based decoding involve forward (alpha) metric updates, backward (beta) metric updates and the Log Likelihood Ratio (hereafter, LLR) calculations.

FIG. 1 illustrates a prior art block diagram of a rate ⅓ Turbo encoder 100 as used in a transmitting device. An input data sequence u(k) 101 (typically binary valued) is directly coupled to an output coupling 103 to produce a systematic data subsequence x(k) (i.e., x(k)=u(k)). The input sequence u(k) is also coupled to a first convolutional encoder 105 to produce a first parity information subsequence $y_1(k)$ 107. The input sequence u(k) is also coupled to a pseudo random interleaver 109 whose output is coupled to a second convolutional encoder 111 to produce a second parity information subsequence $y_2(k)$ 113. The output of the rate ⅓ Turbo encoder 100 is a sequence containing the three subsequences x(k), $y_1(k)$, and $y_2(k)$.

The Turbo encoder of FIG. 1 involves relatively simple logic processing and is usually implemented using Finite State Machine (FSM) controlled hardware. The encoded data stream is transmitted over a noisy channel and is received at a receiving device as an error-prone data stream comprising error-prone systematic and parity information subsequences. A Turbo decoder is used to operate on the received error-prone subsequences in order to produce an error-corrected estimate of input data sequence, u(k).

In many embodiments a rate ½ Turbo decoder is used instead of the aforementioned rate ⅓ Turbo decoder. The rate ½ Turbo decoder discards every other element of the subsequences $y_1(k)$ 107, and $y_2(k)$ 113, so that the encoder's output sequence contains one parity bit for each systematic bit. This process of decimating the parity sequences is known to those skilled in the art as "puncturing."

A Turbo decoder 200 designed according to the most commonly employed Turbo decoding scheme is shown in FIG. 2. At the Turbo decoder 200, the input data subsequences correspond to error-prone versions of the transmitted subsequences. This is because the Turbo decoder generally only has access to the transmitted information after it has been received through a noisy channel. The received error-prone data subsequence x(k) 202, and the received error-prone first parity subsequence $y_1(k)$ 204 are coupled into a first Soft Input Soft Output (SISO) MAP decoder 206. Also coupled into the first MAP decoder 206 is a feedback sequence involving a priori log likelihood information, $\lambda_{in}(k)$, output from a deinterleaver 208. The output from the first SISO MAP decoder 206, $\lambda_{out}(k)$ 207, is coupled to an interleaver 210 which generates a set of a priori information that is coupled to a second SISO MAP decoder 212. The second SISO MAP decoder 212 also takes as input an error-prone parity data subsequence $y_2(k)$ 214 and the error-prone systematic data x(k) 202 after passing through an interleaver 216. As is known in the art, the deinterleaver 208, and the interleavers 210 and 216 use the same interleaving function as used in the encoder 100. The output of the second SISO MAP decoder 212 is a second log likelihood data output sequence, $\lambda_{out}(k)$ 213. The sequence $\lambda_{out}(k)$ 213, like the other data sequences, includes a corresponding element for each bit index k into the input data block. The number k preferably ranges from 0 to N−1, so that there are N elements in each data block. After the data block is operated upon via several iterations through the decoder 200, a hard decision output data element 218 can be produced with low Bit Error Rate (BER).

A summary of the calculations involved in a SISO MAP decoder for a version of the popular Max*-Log-MAP algorithm is provided in the detailed description of the invention. Also refer to the Berrou, Michel and Chass references for further details regarding the Turbo decoder and its implementation. The Turbo decoder of FIG. 2 is well known to involve a significant computational load. When turbo decoding is performed using logarithmic values, the computational load involves accessing the many data values required, data selection, add-compare-select operations, correction factor computations and nontrivial pointer arithmetic.

The combination of computational complexity and the need for power efficient solutions has lead to prior art solutions involving one or more processors coupled to a hardware Turbo decoder. An exemplary prior art communications device 300 is shown in FIG. 3. The communications device 300 may represent, for example, a cellular phone, a wireless basestation, a modem or any other communications device that applies error correction processing to a received signal. The communications device 300 includes a Turbo decoder hardware module 302 and a private memory 304 coupled thereto. The Turbo decoder 302 is coupled to receive information from a communication interface 306. The communication interface 306 generally corresponds to a receiver that provides a demodulated bit stream received from a communication channel 308. The communication channel 308 may be a wireless, wireline, optical, or other type of communication channel.

The Turbo decoder 302 is coupled to a digital signal processor (DSP) 310. The DSP 310 typically is coupled to a private memory 312, for example, on-board memory associated with the DSP 310. The communication device 300 also typically includes a microcontroller 314. While the DSP 310 handles physical layer processing tasks, the microcontroller 314 typically handles link layer and other upper layer processing. In this exemplary prior art system, the DSP 310, the microcontroller 314, and the Turbo decoder 302 are coupled together via a system bus 316. Also coupled to the system bus 316 are a memory module 318, a memory module 320, and an input/output device 322. In some systems, the memories 318 and 320 are merged into a single memory module.

In operation, a communication signal is received from the communication channel 308. The communication signal is then converted by the interface circuitry 306 into a digital data sequence. The received digital data sequence consists of error-prone systematic and parity data. The microcontroller 314 is typically used to write this information to the memory 318. The Turbo decoder 302 then reads a block of the data sequence from the memory 318 and performs Turbo decoding to convert the error-prone data block into an error-corrected data sequence. At the end of the iterative decode process the data is written by the Turbo decoder into the memory 320.

In some embodiments, the DSP 310 performs signal conditioning such as equalization prior to sending the data block to the Turbo decoder. Also, the DSP 310 may also perform baseband processing such as Viterbi Algorithm decoding and speech codec functions. The decoded data from the Turbo decoder will typically be further processed by the microcontroller 314 with its associated memory subsystem 320 before being passed to the data Input/Output logic 322 of the system.

The reason prior art systems use a dedicated hardware Turbo decoder 302 is because it is generally costly and inefficient to implement such a high complexity algorithm in software on a general purpose DSP. For example, each SISO MAP decoder involves branch metric calculations (gamma metrics), a forward recursion through the trellis (alpha metric calculations), a backward recursion through the trellis (beta metric calculations), a soft output calculation and an extrinsic information (LLR) calculation. The Chass reference reports a DSP software implementation of the decoder, but the implementation results in a costly and power consuming solution. This is because general purpose DSP's require many instruction cycles to implement all of the aforementioned operations and the supporting pointer arithmetic to control memory accessing.

While prior art Turbo decoding solutions have been proposed, they have some limiting problems that need to be overcome. For example, Hardware decoders lack flexibility. A change in a standard, a new standard, or any other change in a specification or requirements is difficult to handle when the controlling algorithms are not software programmable. Also, Hardware decoders lack advanced programmable features. Because of this limitation, hardware decoders tend to not have certain features that would be easy to add to a software programmable decoder. Another problem is that hardware decoders consume gates and memory that will not be reused by other functions. The silicon area consumed by a hardware decoder will not be used for other functions whereas the silicon area used to support a software decoder in a DSP can be reused for functions such as speech and audio decompression/decoding and speech recognition. As discussed above, DSP software based implementations are inefficient. To implement a Turbo decoder in DSP software is overly costly in both instructions per second and power consumption. Hence there is a trade off in the prior art between efficient but fixed hardware decoders and inefficient but flexible software decoders.

Based on the foregoing, there is a need for an improved decoding architecture that provides efficiency similar to that of a hardware decoder while still providing the flexibility of a software-implemented decoder. It would be desirable for such a decoder to be reprogrammable and thereby able to deal with new requirements and/or to accommodate a new standard. There is also a need for an improved decoder architecture that could be readily programmed to support advanced features. It would be desirable to have a decoder architecture that could be reused for other functions such as speech and audio encoding/decoding and speech recognition. It would also be desirable to have a programmable and reusable decoder architecture that is tightly coupled to a processor such as a DSP and allows Turbo decoding to be performed using much fewer processor cycles and/or much less power than prior art DSP software-based approaches. There is a need to eliminate the trade off in the prior art between efficiency and programmability of Turbo decoding structures.

SUMMARY OF THE INVENTION

The present invention satisfies the aforementioned needs by providing an improved method and apparatus for implementing a data processor adapted for turbo decoding.

In a first aspect of the invention, an improved processor adapted for decoding is disclosed. In one exemplary embodiment, the processor comprises: a memory that holds a set of state values; an arithmetic unit that supports forward and reverse butterfly update operations; at least one instruction that causes the arithmetic unit to perform a butterfly update operation; and at least one addressing mode that causes a pair of butterfly output state values to be written to a set of locations in the memory, such that the written output states are reordered to be ready for subsequent sequential pair-wise reading as input states in a subsequent butterfly operation. In a second exemplary embodiment, the processor comprises: an ALU adapted to perform forward and reverse trellis butterfly update calculations; at least one instruction operative to cause the ALU to perform at least one of a forward and a reverse trellis update operation; a memory for storing a set of alpha metrics; at least one addressing mode adapted to automatically write at least a pair of first metrics to a permuted set of locations relative to an output address pointer, the permutation arranging the pair for subsequent sequential reading as input state values to a subsequent butterfly operation; a local register file for storing a set of second metrics; and a local register file for storing a set of third metrics; whereby when the instruction executes, the ALU selectively couples at least some of the first, second, and third metrics into the ALU to selectively perform one of a first metric update and a second metric update.

In a second aspect of the invention, an improved arithmetic logic unit (ALU) apparatus for use in, inter alia, a data processor, is disclosed, the ALU generally comprising: at least one control bus adapted to carry at least one control signal thereon; local first and second memory areas and memory busses, respectively; and a partitioned memory and a partitioned memory bus; a plurality of selection units, each of the units having a plurality of inputs and at least one output, the plurality of inputs comprising a first input coupled to the partitioned memory bus, a second input coupled to the first memory bus, and a third input coupled to the second memory bus, the selection units being adapted to select one or more of the data inputs, the control of the selection function being related at least in part to the control signal present on the control bus. In one exemplary embodiment, a plurality of arithmetic units are also provided, each of the arithmetic units having at least two inputs corresponding to the outputs of at least two of the selection units operative to arithmetically combine the at least two input values. At least one compare unit is also provided, having as an input the output of at least one of the arithmetic units, and at least one result multiplexer having the same inputs as the respective one of the one compare unit and being controlled by the output of the compare unit(s).

In a third aspect of the invention, an improved communication system incorporating the aforementioned processor is disclosed. The system generally comprises a processor with ALU capable of selectively performing a forward and a reverse MAP butterfly update operations in response to at least one instruction, and at least one MAP decoder software routine comprising the at least one butterfly update instruction. In one exemplary embodiment, the system further comprises a first MAP decoder module adapted to execute the at least one MAP decoder software routine, whereby the MAP decoder executes a forward trellis update and a reverse trellis update recursion and computes a first likelihood output sequence. An interleaver coupled to receive this first likelihood sequence is also provided. A second MAP decoder module adapted to execute at least one of the MAP decoder software routines is also provided, the second MAP decoder executing a forward and a reverse trellis update recursion to compute a second likelihood output sequence. A deinterleaver receives this second likelihood sequence and provides feedback to the first MAP decoder in the form of a permuted likelihood sequence.

In a fourth aspect of the invention, an improved method for performing a butterfly operation for implementing a decoder in a digital processor having a memory and arithmetic logic unit (ALU) associated therewith is disclosed. The method generally comprises: disposing old path metrics in the memory; disposing a set of first metrics in a local storage device associated with the ALU; providing a butterfly update instruction within the instruction set of the processor; providing the old path metrics as inputs to the ALU; providing the first metrics as inputs to said extension ALU; and providing at least one addressing mode for the memory which causes a set of new path metrics to be reordered and written back to memory subsequent to execution of the butterfly update instruction. In one exemplary embodiment, the processor comprises an extended processor having an XY memory, and the reordering of new path metrics occurs in such a way that the written values can be subsequently sequentially accessed as old path metric inputs to a subsequent butterfly update instruction.

BRIEF DESCRIPTION OF THE DRAWINGS

The features, objectives, and advantages of the invention will become more apparent from the detailed description set forth below when taken in conjunction with the drawings, wherein:

FIG. 8b illustrates an exemplary correction look up table included in the extension ALU.

FIG. 14a is a software listing providing an example of how the forward recursion of a MAP decoder can be coded when an extension ALU is present to execute butterfly operations and perform related pointer manipulations.

DETAILED DESCRIPTION

Reference is now made to the drawings wherein like numerals refer to like parts throughout.

As used herein, the term "processor" is meant to include any integrated circuit or other electronic device capable of performing an operation on at least one instruction word including, without limitation, reduced instruction set core (RISC) processors such as the user-configurable core manufactured by the ARC International, central processing units (CPU's), and digital signal processors (DSP's). The hardware of such devices may be integrated onto a single piece of silicon ("die"), or distributed among two or more die. Furthermore, various functional aspects of the processor may be implemented solely as software or firmware associated with the processor.

Additionally, it will be recognized that the term "stage" as used herein refers to various successive stages within a pipelined processor; i.e., stage 1 refers to the first pipelined stage, stage 2 to the second pipelined stage, and so forth.

Furthermore, the term "storage device" is used to refer to a device adapted to store one or more pieces of data. While the following description is cast primarily in terms of an XY memory of the type well known in the art, it will be recognized that other types of memory and storage devices may be used consistent with the invention. Specifically, any type of storage device having an address space that can be functionally partitioned or divided into two or more "component" spaces, whether physically integrated or otherwise, may be substituted.

As used herein, the terms "arithmetic" and "arithmetic unit" refer to operations and devices for performing arithmetic operations including, without limitation, addition, subtraction, multiplication, comparison of two or more values, division, shifting of one or more bits, and the like.

It is also noted that while portions of the following description are cast in terms of VHSIC hardware description language (VHDL), other hardware description languages (HDL) such as Verilog® may be used to describe various embodiments of the invention with equal success. Furthermore, while an exemplary Synopsys® synthesis engine such as the Design Compiler 2000 (DC00) is used to synthesize the various embodiments set forth herein, other synthesis engines such as Buildgates® available from, inter alia, Cadence Design Systems, Inc., may be used. IEEE std. 1076.3-1997, IEEE Standard VHDL Synthesis Packages, describe an industry-accepted language for specifying a Hardware Description Language-based design and the synthesis capabilities that may be expected to be available to one of ordinary skill in the art.

Figure 4:
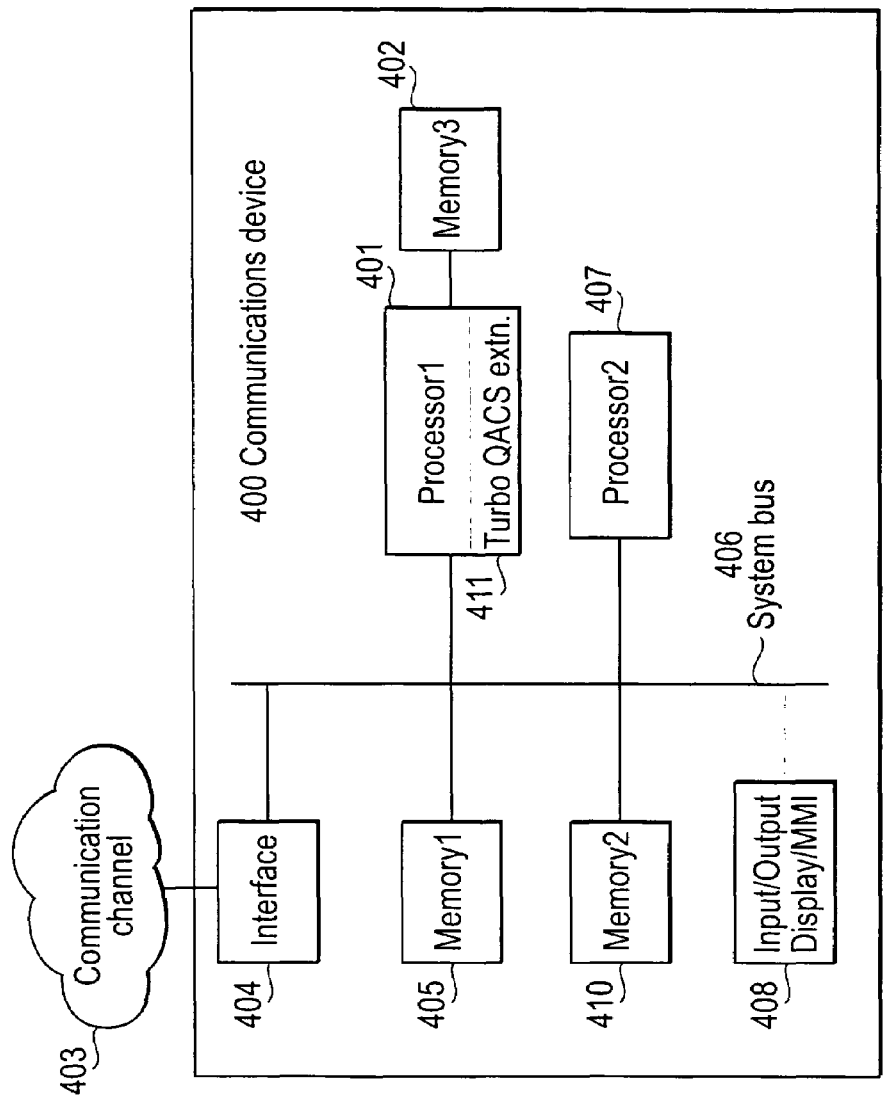
FIG. 4 is an exemplary block diagram of a communications device fitted with a data processor adapted for Turbo decoding.

Referring to FIG. 4, an exemplary communications device 400 designed in accordance with the present invention is illustrated in block diagram form. The communications device 400 may represent, for example, a cellular phone, a wireless basestation, a modem or any other communications device that performs error correction processing to a received signal. The communication device 400 includes a communication interface 404 that is coupled to receive information from a communication channel 403. The communication interface 404 may be implemented using a wireless receiver, a wireline modem demodulator, or an optical receiver circuit, for example. The communications interface 404 provides digital data and couples this digital data to a system bus 406. The system bus 406 provides couplings to a first processor 401, a memory 405, a second processor 407, and an input-output device 408. In some embodiments there is an additional memory 410 for use primarily by the second processor 407. In a preferred embodiment, the first processor corresponds to a DSP, a DSP core, a RISC or a RISC core, and the second processor corresponds to a microcontroller. In some embodiments, the first processor 401 and the second processor 407 are implemented with a single processor that performs both DSP and microcontroller functions.

It should be noted that the coupling provided by the system bus 406 could be provided by a variety of connection topologies. For example, separate dedicated connections can be implemented between any two or more of the modules 401, 404, 405, 407, 408, and 410. Also, a switching arrangement could be used to couple all or some these modules together. Dedicated and/or switched paths provide additional data transfer bandwidth over the illustrative system bus arrangement, but provide equivalent coupling functionality. Hence it is to be understood that the exemplary system of FIG. 4 contemplates all such alternative arrangements, and these alternative arrangements would be obvious to one skilled in the art.

The first processor 401 is preferably coupled to a private memory block 402. The private memory 402 is typically implemented as an on-board memory and is tightly associated with the first processor 401. In accordance with an aspect of the present invention, the processor 401 is configured to include an extension ALU 411 with its supporting hardware to support the execution of an extension instruction, e.g. a Turbo Quad Add Compare Select (hereafter referred to as TQACS) instruction. The extension hardware 411 and the extension instruction provide an improved data processor for implementing MAP based decoders (e.g., as used within Turbo decoders) in software. The extension instruction involves an improved Quad Add Compare Select instruction and ALU that are adapted to decoding operations involving alpha, beta and gamma metrics, LLR processing and specialized memory addressing modes needed to support MAP and/or Turbo decoding. In a preferred embodiment, the hardware that supports the extension instruction is written in a hardware description language (HDL). The hardware support for the extension instruction preferably allows the first processor 401 to execute the extension instruction in a single cycle and with less power as compared to a processor that executes an equivalent sequence of operations using standard software instructions.

In operation, the data transmitted over the communication channel 403 is received by the interface 404 and converted into a stream of received error-prone bits. These received values are stored in a memory such as the memory 405. Depending on the implementation, the error prone bits may be delivered from the interface 404, or the processor 401. In some embodiments a multi-bit sample stream is delivered from the interface. In such embodiments, the processor 401 performs symbol timing recovery, equalization, and/or other signal conditioning to estimate the error-prone bit sequence to be used as the primary input to the Turbo decoder.

Figure 3:
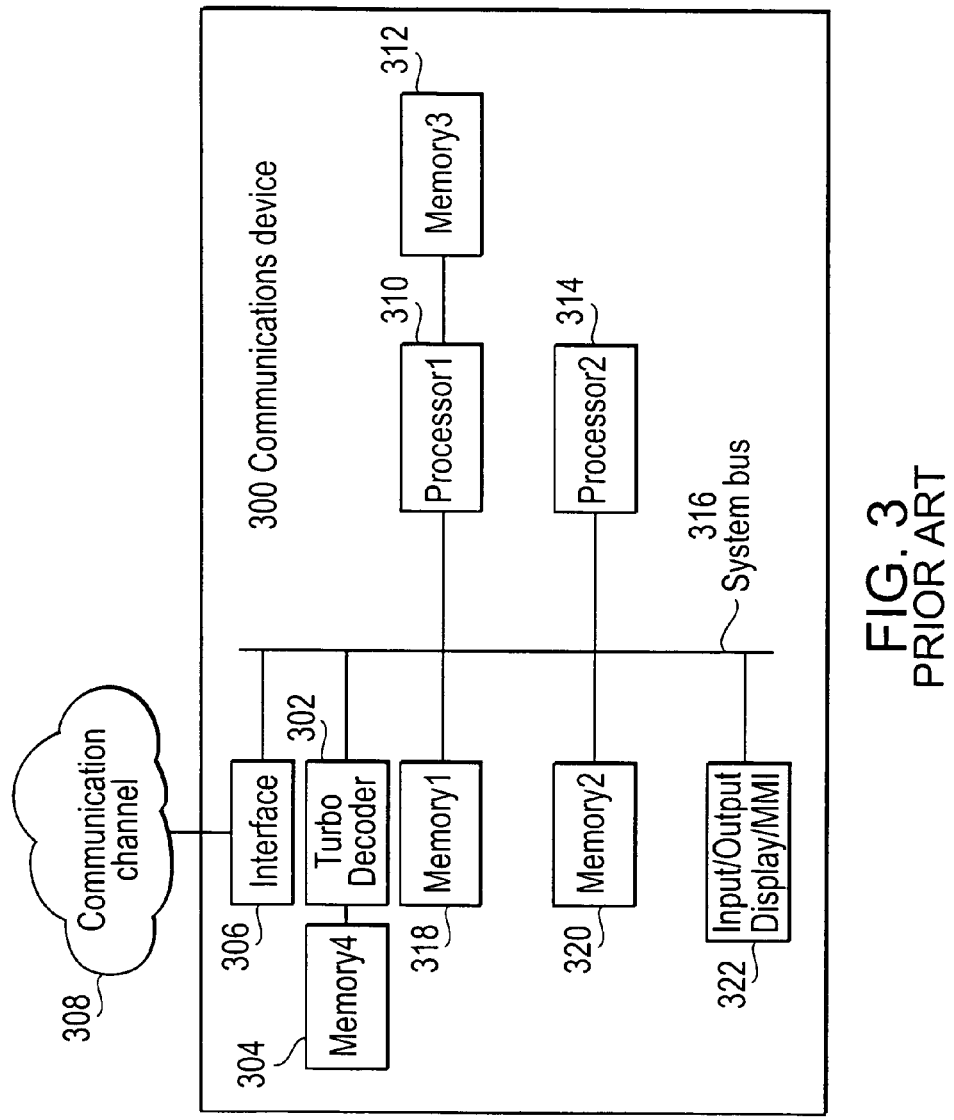
FIG. 3 is a diagram of a prior art communications device fitted with a separate hardware module for Turbo decoding.

To perform a decoding operation, the first processor 401 reads the data out of the memory via the system bus 406. Other coupling arrangements such as processor-controlled or DMA transfers from the communications interface 404 directly to the private memory 402 may also be used in some embodiments. Software executed by the processor 401 performs the Turbo decoding algorithm as previously discussed in connection with FIG. 3. The extension instruction such as the TQACS instruction is used to allow the processor 401 to implement the Turbo decoder algorithm efficiently. Typically the data will be further processed by the second processor (e.g., microcontroller for link and upper layer processing) 407 before being sent to the input/output module 408.

An advantage of the inventive approach is that the DSP memory used to store Turbo decoding coefficients can be re-used for other algorithmic processing to reduce memory requirements and unit costs. Programmable features can also be readily added to the software-based decoder. Also, the extension hardware can preferably be reprogrammed to implement similar algorithms such as Viterbi decoders used in audio coding applications and speech recognition. The extension ALU allows a software-based decoder to be constructed with an efficiency comparable to a custom hardware decoder. The detailed operation of the processor 401 with the extension ALU and the TQACS instruction is described in detail hereinbelow in connection with FIG.'S 5–13.

Figure 5:
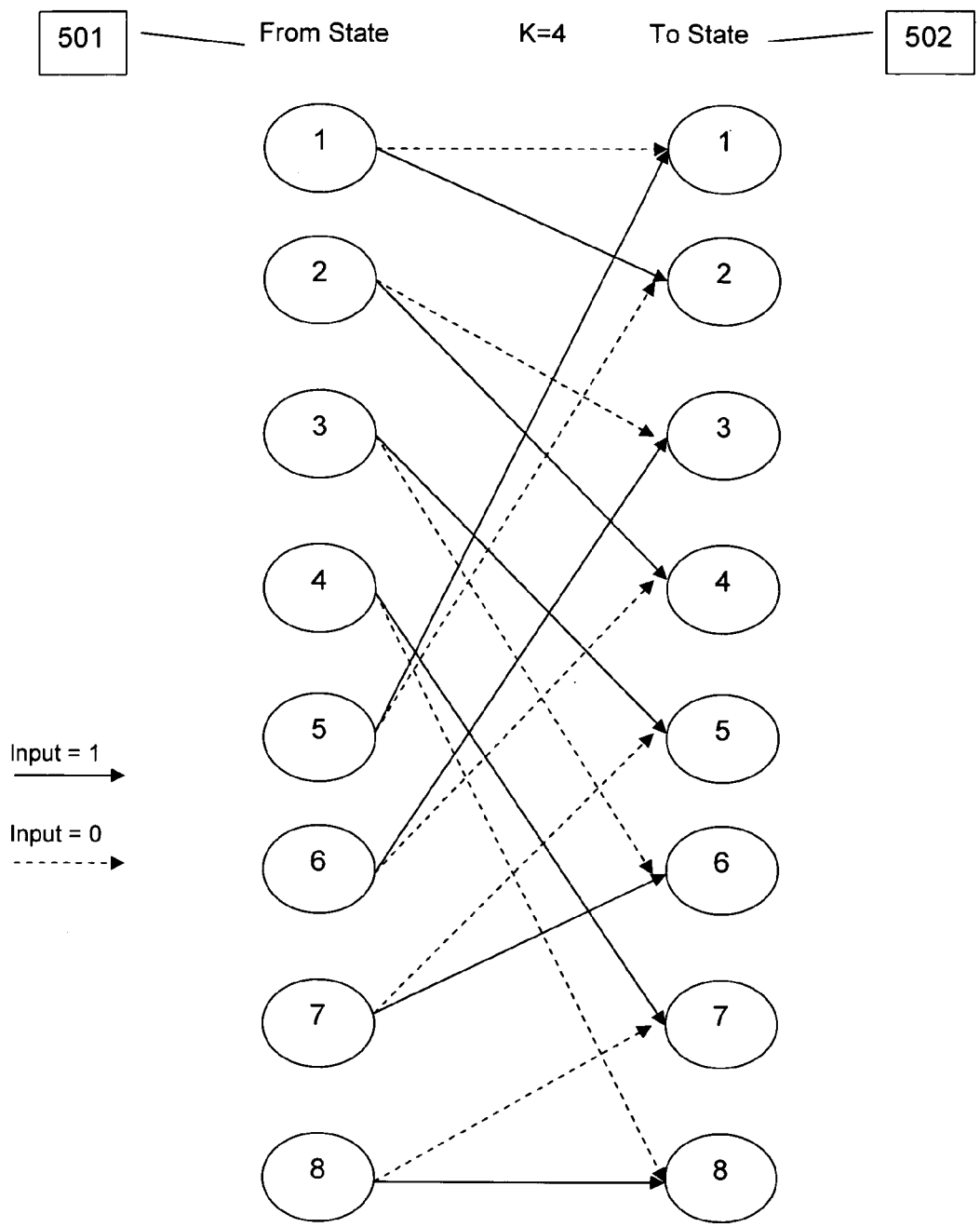
FIG. 5 is the trellis diagram for the eight state 3GPP cellular standard Turbo code.

A Turbo coding trellis diagram as used with the 3$^{rd}$ Generation Partnership Project cellular standard is provided in FIG. 5. As can be seen from the columns of circles representing states, the code has eight states. The column marked "From State" 501 has eight states labeled 1 through 8. Each state has two possible paths leading to an associated new state 502. The state transition is selected based upon the result of an add-compare-select (ACS) operation performed in the MAP decoder.

Referring again to FIG. 5, a "butterfly" logically connects two previous-state values to two next-state values via the four possible paths between them. For example, butterfly patterns represent all possible transitions between pairs of states as follows: {(m1, m5), (m1, m2)}, {(m2, m6), (m3, m4)}, {(m3, m7), (m5, m6)}, and {(m4, m8), (m7, m8)}. The butterfly calculation therefore requires the reading of two previous or "old" values from memory, four path calculations, and the writing of two most probable new values back to memory. This process is widely known as the metric update stage of the MAP decoder. Both forward (alpha) and backward (beta) metric updates must be computed in the Turbo decoder. The number of these metrics to be computed in each iteration of the Turbo decoder is $4N \times 2^{(K-1)}$) where N is the number of bits in the data block and K is the constraint length of the encoder. Therefore, the efficient implementation of butterfly calculations is critical to reducing the overall complexity of the Turbo decoder. The TQACS instruction and its associated extension hardware perform the butterfly computations, make additional necessary calculations required for the selected MAP decoder (e.g., Max-Log-MAP or Max*-log-MAP), and combine gamma metrics, alpha metrics and beta metrics under software control.

The butterfly diagram of FIG. 5 illustratively defines a core inner-loop set of operations involved in MAP decoding. The inner loop of the map decoder is known as a MAP butterfly operation and the processing of a state update equation is a MAP butterfly update (MBU) operation. The function of the MAP decoder is to produce a refined probability distribution of each systematic bit, $x_k$, in a frame being a 0 or 1. The output of the map is in the form of a Log Likelihood Ratio (LLR) where increased certainty is represented by larger absolute numbers. The Bahl, Cocke, Jelinek, and Raviv (BCJR) algorithm of the Bahl reference for MAP decoding can be broken into several steps and simplifications applied to make computation easier. While several versions of the BCJR and Turbo decoding algorithms exist, the algorithm below is described by way of example and considered to be a preferred embodiment of the algorithm for implementation in the TQACS architecture. It should be readily noted that the TQACS architecture can be equivalently reconfigured by a skilled artisan to implement different versions of the MAP and/or Turbo decoder algorithm; for example a version that uses symmetric branch metrics. The modifications to the architecture needed in such cases are made by mapping a modified set of state equations associated with the particular version of the algorithm into the hardware architecture of FIG. 8*a*. For now, consider the version of the MAP decoder algorithm as described below:

1. Branch Metric Calculation

Branch metrics are analogous to the local distance metrics used in Viterbi Algorithm (VA) decoding. The branch metric represents the logarithm of probability of a particular branch, b, being taken at time step k. Branch metrics are calculated using the received systematic and parity information together with a priori information, $\lambda(k)$. The branch metric for the transition m'→m using the source symbol $u_b$ under knowledge of the received symbol $x_k$, is denoted as:

$$\gamma_k(m,m',I_k) = Pr\{m,m',I_k|x_k\}.$$

For each received symbol, four gamma branch metrics are calculated. This is because in a binary system at any particular state, m, the encoder input could have been a binary '0' or '1' and the encoder output could have been a binary '0' or '1'. In the exemplary embodiment the gamma metric calculations are performed as follows:

$$S1(k)=x(k)+\lambda(k)$$

$$S3(k)=y(k)$$

Where x(k) is the systematic input at step 'k'
y(k) s the parity input at step 'k'
$\lambda(k)$ is the a priori information at step 'k'

$$\gamma_{00}(k)=0$$

$$\gamma_{01}(k)=S1(k)$$

$$\gamma_{10}(k)=S3(k)$$

$$\gamma_{11}(k)=S1(k)+S3(k)$$

Where $\gamma_{ub}$ is the transition metric and 'u' represents the input into the encoder at time k and 'b' represents the output of the encoder at time k. Both 'u' and 'b' are binary values (1 or 0) which gives the four possible transition metrics for each time step. Gamma calculations of this form usually require bipolar (signed) metrics.

2. Forward State Metric Computation, α

Alpha metric computations are analogous to accumulating state metrics in the VA. The alpha metric represents the log probability of reaching encoder state m having received k symbols $x_0^{k-1} = (x_0, x_1, \ldots, x_{k-1})$: $\alpha_k(m) = \Pr\{m|x_0^{k-1}\}$. Using the fact there are only two branches leading to each state, log alpha for each state can be calculated as:

$$\log \alpha_k(m) = \max(\log \alpha_{k-1}(m'_t) + \log \gamma_t, \log \alpha_{k-1}(m'_b) + \log \gamma_b) + \log(1 + e^{j \log \alpha_{k-1}(m'_t) - \log \alpha_{k-1}(m'_b)}).$$

Where the subscripts t and b denote the top and bottom branches leading to state m, and the second correction term can be replaced by a small combinatorial look up table. FIG. 5 shows how the gamma branch metrics relate to the eight possible states. For example if we calculate a new metric in the forward direction, i.e., a new $\alpha_1$, then we need to calculate old $\alpha_1 + \gamma_{00}$ and also old $\alpha_5 + \gamma_{11}$. In the exemplary embodiment and referring to the 3GPP trellis of FIG. 5 and the ALU's marked alu0, alu1, alu2 and alu3 as discussed in connection with FIG. 8A, the following mappings of gamma metrics and alpha's can be obtained:

TABLE 1

| | | | | Output | |
|---|---|---|---|---|---|
| Alu0 | Alu1 | Alu2 | Alu3 | alu0/1 | alu2/3 |
| $\alpha_1 \gamma_{00}$ | $\alpha_5 \gamma_{11}$ | $\alpha_1 \gamma_{11}$ | $\alpha_5 \gamma_{00}$ | $\alpha_1$ | $\alpha_2$ |
| $\alpha_3 \gamma_{01}$ | $\alpha_7 \gamma_{10}$ | $\alpha_3 \gamma_{10}$ | $\alpha_7 \gamma_{01}$ | $\alpha_5$ | $\alpha_6$ |
| $\alpha_2 \gamma_{10}$ | $\alpha_6 \gamma_{01}$ | $\alpha_2 \gamma_{01}$ | $\alpha_6 \gamma_{10}$ | $\alpha_3$ | $\alpha_4$ |
| $\alpha_4 \gamma_{11}$ | $\alpha_8 \gamma_{00}$ | $\alpha_4 \gamma_{00}$ | $\alpha_8 \gamma_{11}$ | $\alpha_7$ | $\alpha_8$ |

3. Reverse State Metric Computation, β

β represents the probability of getting from encoder state m' to the final state in step N with the symbols $x_{k+1}^N$, that is, $$\beta_{k+1}(m') = \Pr\{x_{k+1}^N | m'\}.$$

Log Beta for each state can be calculated as:

$$\log \beta_{k+1}(m') = \max(\log \beta_{k+1}(m_t) + \log \gamma_t, \log \beta_{k+1}(m_b) + \log \gamma_b) + \log(1 + e^{j \log \beta_{k+1}(m_t) - \log \beta_{k+1}(m_b)}).$$

Figure 8A:
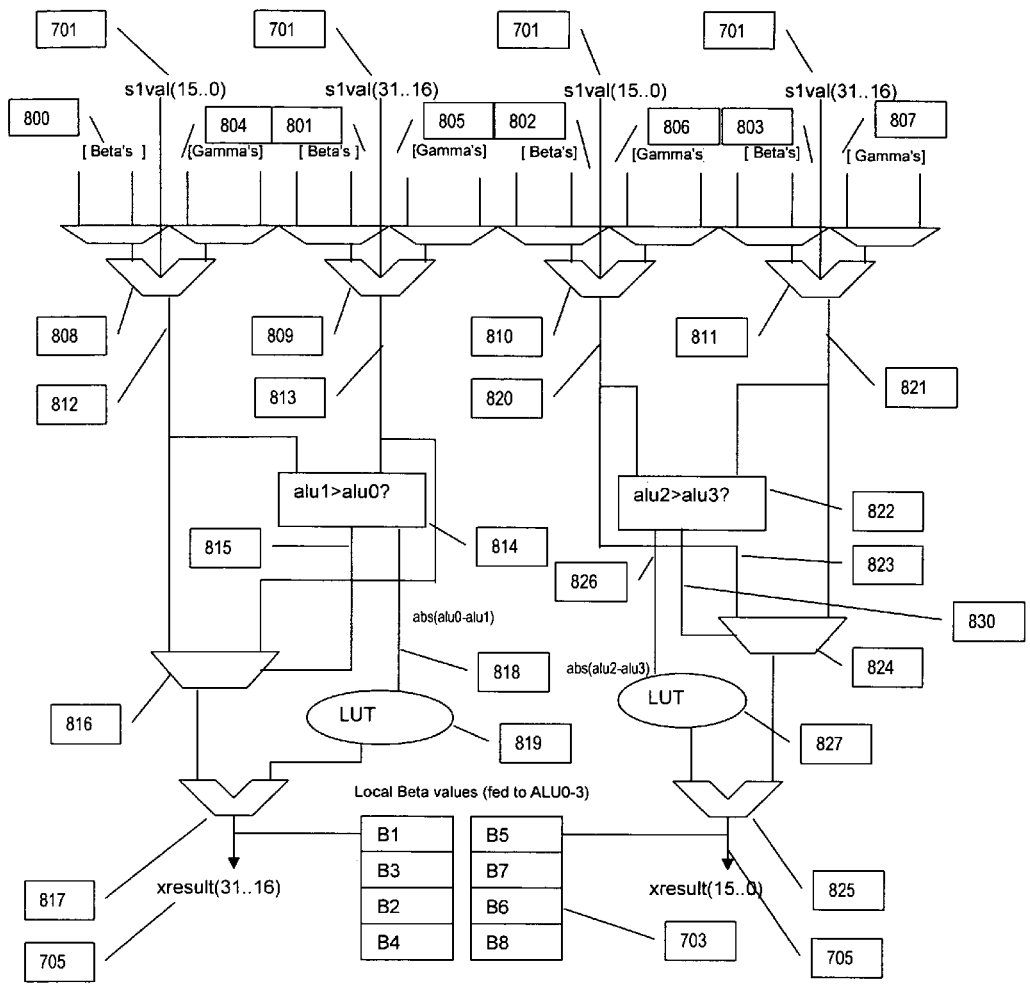
FIG. 8a is a logical block diagram of an exemplary embodiment of the extension ALU that performs the Turbo QACS functionality.

In the exemplary embodiment, referring to the 3GPP trellis of FIG. 5 and the ALU's marked alu0, alu1, alu2 and alu3 in FIG. 8A, the following mappings of gamma metrics and beta's can be obtained:

TABLE 2

| | | | | Output | |
|---|---|---|---|---|---|
| Alu0 | Alu1 | Alu2 | Alu3 | alu0/1 | alu2/3 |
| $\beta_1 \gamma_{00}$ | $\beta_2 \gamma_{11}$ | $\beta_1 \gamma_{11}$ | $\beta_2 \gamma_{00}$ | $\beta_1$ | $\beta_5$ |
| $\beta_5 \gamma_{01}$ | $\beta_6 \gamma_{10}$ | $\beta_5 \gamma_{10}$ | $\beta_6 \gamma_{01}$ | $\beta_3$ | $\beta_7$ |
| $\beta_3 \gamma_{10}$ | $\beta_4 \gamma_{01}$ | $\beta_3 \gamma_{01}$ | $\beta_4 \gamma_{10}$ | $\beta_2$ | $\beta_6$ |
| $\beta_7 \gamma_{11}$ | $\beta_8 \gamma_{00}$ | $\beta_7 \gamma_{00}$ | $\beta_8 \gamma_{11}$ | $\beta_4$ | $\beta_8$ |

Figure 6:
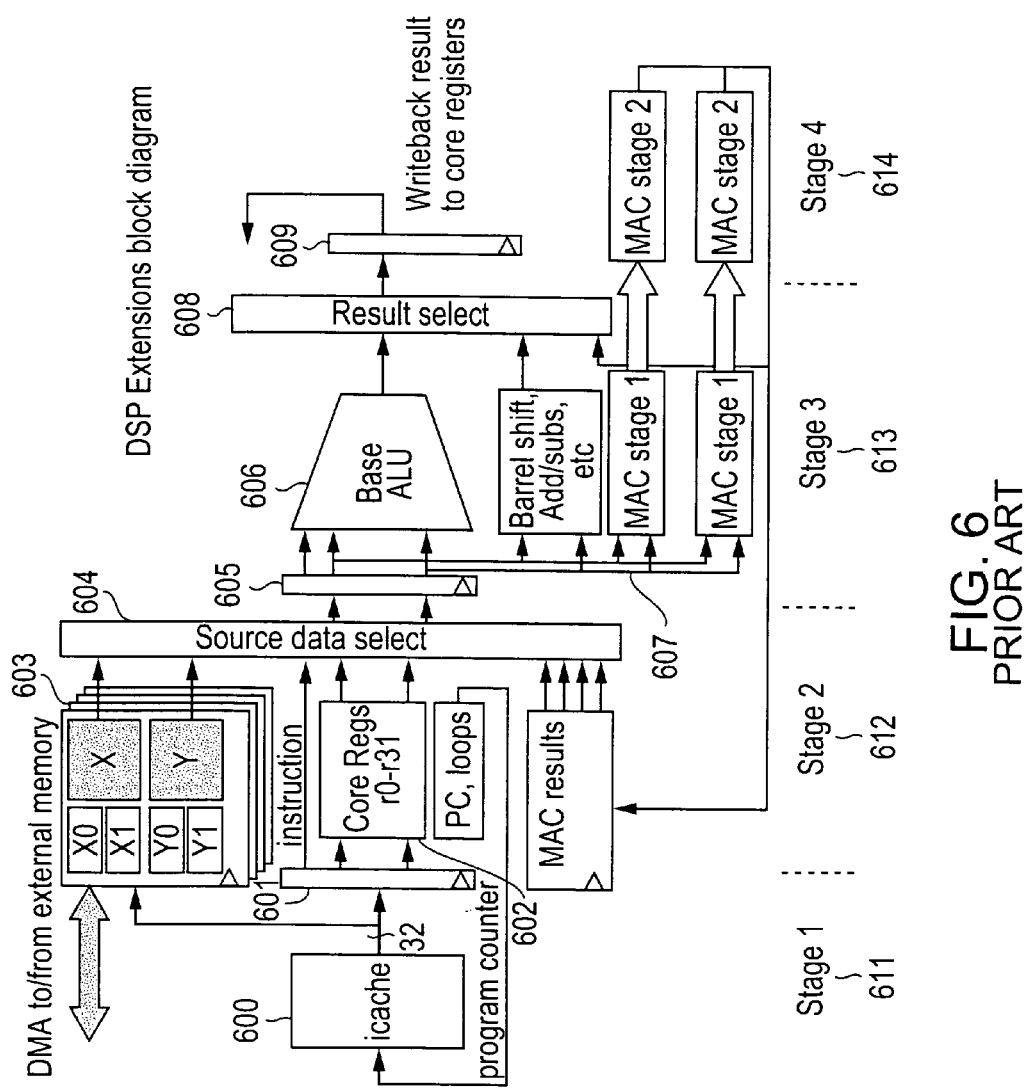
FIG. 6 is functional block diagram illustrating the architecture of an exemplary prior art RISC/DSP processor (such as that produced by the Assignee hereof), prior to inclusion of the apparatus of the present invention.

Referring now to FIG. 6, in one exemplary embodiment of the invention, a method and apparatus are applied to a user-configurable extensible data processor, such as the ARCtangent™ processor 600 produced by the Assignee hereof. The architecture of the ARCtangent™ processor (prior to the implementation of the present invention) is shown as FIG. 6 herein for illustration purposes. It will be recognized, however, that the present invention may be applied with equal success to other processor devices, including for example a fixed architecture digital signal processor (DSP), a RISC processor or a RISC core, or even a CISC processor if desired.

The present invention assumes the use of memory 603 (e.g., XY memory) of the type which is commonly used in processors for efficiently reading and writing data. An address generation unit (not shown) is used to perform the pointer address arithmetic to efficiently access data in the XY memory. The XY memory is preferably implemented with at least one read port and one write port for each of the X and the Y memories. In some embodiments the write port may be the same (via time multiplexing) as the read port. In the case of the processor depicted in FIG. 6, a four-stage pipeline is shown. In stage 1 611, instructions are fetched from the instruction cache 600. In stage 2 612, one or two operands are fetched from XY memory 603 or the core registers 602. In stage 3 613, the instruction is performed in either the base ALU 606 or in one of a number of user-selectable and configurable instruction units 607. In stage 4 614 of the pipeline, the results of the instruction execution are written back to XY memory 603 or the core registers 602. In the exemplary embodiment, a result from the parallel ALU's in stage 3 is selected by a selector 608 before being latched by a latch 609 and written back to core registers or XY memory.

Figure 7:
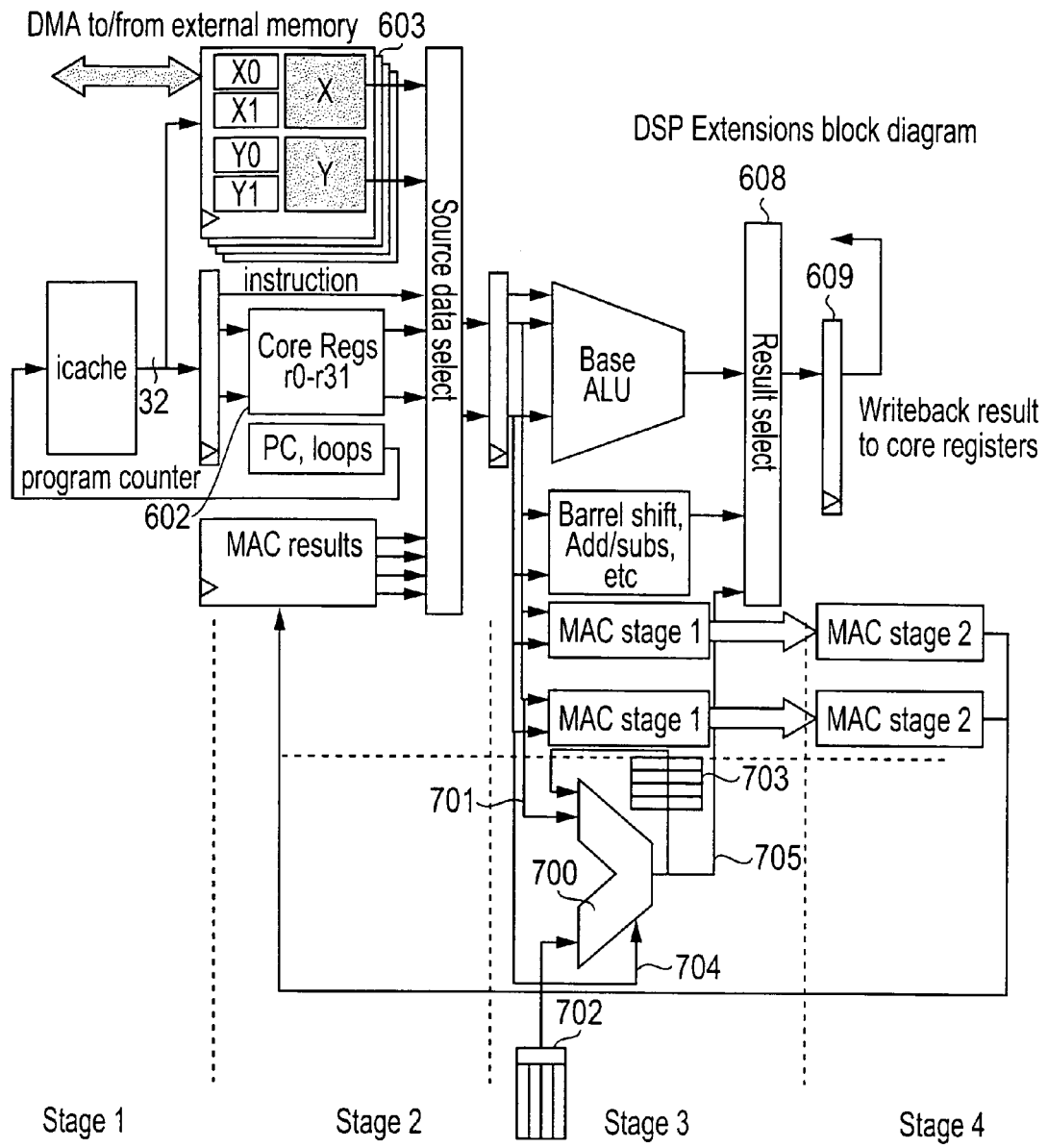
FIG. 7 is functional block diagram illustrating the architecture of the exemplary RISC/DSP processor of FIG. 6 modified to include the extension ALU of the present invention.

Referring now to FIG. 7, one exemplary embodiment of the processor of FIG. 6, as modified according to the present invention, is described. In the embodiment of FIG. 7, an extension ALU 700 is added to the RISC-DSP processor in stage 3 of the pipeline. The extension ALU 700 is added to perform the TQACS instruction that takes in, for example, up to three source data inputs. It should be noted that the extension unit of the present invention may be implemented as a native portion of a customized processor in some embodiments. Hence the term "extension unit" refers generally to an extension of a core processor, irrespective of whether it is added to a core processor or whether the entire processor is designed as a custom processor.

A first instruction operand, operand 1, corresponding to 701, may be used to designate input to be drawn from DSP memory 603 or the core registers 602, a local RAM 702 (e.g., gamma metrics) and/or from eight integrated core registers 703 (e.g., beta metrics). Operand 1, when used with the TQACS instruction typically contains multiple alpha or beta metrics packed into the data width available. In the exemplary design two 16-bit alphas or two 16-bit betas are packed into the 32-bit operand 1. This Single Instruction Multiple Data (SIMD) approach can be easily extended so that all alpha or beta metrics for a particular symbol could be processed in a single clock cycle. In the case of the 3GPP turbo decode with eight states, eight metric values represented using 8-bit values could be packed into a 64-bit wide XY memory.

A software programmer can control the detailed operation of the ALU by using user programmable bits in the instruction, for example, inter alia, short immediate data bits (shimm bits). Other control schemes will become apparent to those skilled in the art, for example, additional instructions may be specified or registers may be used to contain the equivalent of shimm bits. Similarly, a sequencer could be optionally added to the extension ALU 700 (not shown) and could be programmed to automatically generate a sequence of control bits needed to implement a specific implementation of a MAP decoder.

In the exemplary embodiment, the shimm bits are passed to the TQACS extension ALU as a second operand to the TQACS instruction. In the processor, the shimm bits are preferably passed from Stage 2 of the pipeline 704 to stage 3. Two output results of the extension ALU 700 are selected, concatenated, latched and written back to DSP memory or core registers in the aforementioned manner using the selector 608 and the latch 609. In the exemplary embodiment the bit widths of input 1 701, the corresponding gamma metrics 702, and output data 705 are all 32 bits. Also, more than one data word, for example two 16-bit data words can be packed into these 32 bits. It is obvious to DSP engineers that other bit widths may be selected and the selection of a set of specific bit widths corresponds to a design choice.

In accordance with an aspect of the present invention, the extension ALU 700 can be extended in a Single Instruction Multiple Data (SIMD) manner to perform alpha metric updates, beta metric updates and LLR calculations on multiple data paths to increase performance. For example, the processing of eight alpha metrics or eight beta metrics in parallel will provide a four fold increase in performance. To extend the ALU 700 using SIMD techniques, the hardware of the extension ALU 700 is replicated one or more times so that a single instruction can control the equivalent of more than one extension ALU 700 at a time to produce multiple outputs in parallel. In some SIMD implementations, the shimm bit field may be extended so that different ones of the extension ALU's execute the same instruction but perform possibly different operations.

The TQACS extension ALU 700, together with the local beta metric storage 703 is shown in more detail in FIG. 8a. FIG. 8a provides an exemplary embodiment of an extension ALU that supports a MAP butterfly update (MBU) instruction. In the exemplary embodiment two 16 bit alpha or beta path metrics are packed into the 32 bit operand 1 701. The exemplary processing of 2 alpha or beta metrics, the paths in between them and the write back for every clock cycle allows processing of old and new metric data arranged in the aforementioned butterfly configuration. Other implementations with different bit widths and packing of data would be equally successful. For example eight alpha or beta metric updates could be performed in parallel using eight, 8-bit alpha or beta path metrics packed into a 64-bit data word, and performing 4 butterfly operations in parallel. A set of four beta metric multiplexers 800, 801, 802, 803 optionally select one of eight locally stored beta metrics as one of the three inputs to the main ALUs 808, 809, 810, 811. Four gamma select multiplexers 804, 805, 806, 807 select between one of four gamma branch metrics packed into a data word read from a local RAM. In other embodiments the gamma branch metrics might be calculated directly, rather than pre-calculated and stored in a local memory in order to save silicon area at the cost of a longer critical path and consequent reduced maximum operating frequency. The control of the gamma branch metric memory 702, the gamma branch metric selection multiplexers 804, 805, 806, 807, the beta selector multiplexers 800, 801, 802, 803, and the storing of beta metric values to the local memory is accomplished by the decoding of user programmable data bits within the instruction word. In the exemplary embodiment the user programmable data bits are short immediate (shimm) data bits available in the aforementioned instruction set. In other embodiments other user programmable control bits might be used to control the detailed operation of the TQACS ALU.

In a preferred embodiment, the TQACS extension ALU is programmed to compute forward and backward state metric computations according to the MAP decoder algorithm. These computations correspond to butterfly operations as previously discussed.

Prior to performing the forward and backward state metric computations, though, a set of transition metrics (gammas) are computed as previously discussed in connection with FIG. 5. These transition metrics are analogous to local distance values in the well known Viterbi Algorithm. The gamma metrics can be calculated in a number of ways that are mathematically equivalent. In the exemplary embodiment they are calculated relative to $\gamma_{00}$, with $\gamma_{00}=0$ and other gammas either positive or negative with respect to $\gamma_{00}$. This has the advantage only three transition metrics need to be pre-calculated and stored. It is obvious to one skilled in the art that alternative schemes for calculating transition metrics that use symmetry to reduce the number of calculations can be equivalently used with equal success.

As previously discussed in connection with FIG. 5, the forward recursion starts at low values of k and proceeds to higher values of k. Two outputs are computed per butterfly. The forward state metric recursion can be written as:

$$\log \alpha_k(m) = \max(\log \alpha_{k-1}(m'_t) + \log \gamma_t, \log \alpha_{k-1}(m'_b) + \log \gamma_b) + \log(1 + e^{|\log \alpha_{k-1}(m'_t) - \log \alpha_{k-1}(m'_b)|}). \quad (1)$$

In the above equation, m corresponds to one of the two output states of the butterfly (top or bottom), and $m'_t$ and $m'_b$ respectively correspond to top and bottom input states of the butterfly. The $\gamma_t$ and $\gamma_b$ values respectively correspond to top and bottom γ-metrics i.e. the correct transition metric, $\gamma_{ub}$, is chosen out of the four possibilities for the top and bottom branches. The correct transition metric, $\gamma_{ub}$, may be chosen using as described in Tables 1 and 2 above. Again, it is apparent to those skilled in the art that a number of versions of the Turbo decoder and MAP decoder algorithms exist, and depending on which version is implemented, the Tables 1 and 2 may change accordingly. The present invention can be embodied in accordance with these other versions of the MAP decoder algorithm or other variations to be developed, and all such embodiments are within the teaching and scope of the present invention.

Also as previously discussed in connection with FIG. 5, the backward recursion starts at high values of k and proceeds to lower values of k. The backward state metric computation can be similarly written as:

$$\log \beta_{k+1}(m') = \max(\log \beta_{k+1}(m_t) + \log \gamma_t, \log \beta_{k+1}(m_b) + \log \gamma_b) + \log(1 + e^{|\log \beta_{k+1}(m_t) - \log \beta_{k+1}(m_b)|}). \quad (2)$$

Two backward recursion outputs are computed to obtain the two (top and bottom) state metric outputs of the backward butterfly. Also, in these update equations, the γ-values correspond to the gamma metrics that are updated for each iteration through the decoder. Refer to the Tables 1 and 2 to see an example of how the gamma values are selected. Several iterations of the turbo decoder are typically needed to converge to a good estimate. For further details see the Berrou and Chass references.

One exemplary embodiment of the TQACS extension ALU 700 is shown in further detail in FIG. 8a. The TQACS extension ALU supports the TQACS instruction used to compute the aforementioned forward and backward recursions. Since the exemplary embodiment performs a complete butterfly operation in a single cycle it generally accepts two old metrics and produces two new metrics. The symmetry in FIG. 8a. is a result of two logic arrangements, each performing the calculation of an alpha metric (according to equation (1)) or a beta metrics (according to equation (2)). That is, at a given time, the embodiment illustrated in FIG. 8a computes one of equations (1) or (2) twice, in order to compute the top and bottom butterfly outputs. The equation for the top and bottom outputs are the same, but the gamma's are selected differently. See Tables 1 and 2 above and Table 3 below for examples of how this is performed.

In operation only the gamma value selected will be different between the left hand circuit and the right hand circuit. For example, referring to the butterfly diagram of FIG. 5. if the input data contained old metrics 1 and 5, the left hand circuit will produce new metric 1 and the right hand circuit new metric 2. Because the forward and backward butterfly operations involve similarly structured computations, the discussion below focuses on the forward update. Backward updates are computed similarly but generally take the input of previous state metrics from locally held values within the Turbo QACS ALU i.e. the resultant Beta metrics from one symbol become the input values to the next one. In the exemplary embodiment, two 16 bit alpha path metrics are packed into a 32 bit input operand. This operand corresponds to the data operand of the TQACS instruction and is typically input from X-Y memory over path 701. The exemplary processing of two alpha metrics, the paths in between them and the two write backs for every clock cycle allows processing of old and new metric data arranged in the aforementioned butterfly configuration. Other implementations with different bit widths and packing of data would be equally successful for example 8 alpha metric updates could be performed in parallel using eight, 8-bit alpha path metrics packed into a 64 bit data word, performing 4 butterfly operations in parallel.

In the reverse recursion, four metric multiplexers 800, 801, 802, 803 each optionally select one of eight locally stored beta metrics as one of the three inputs to the ALU's 808, 809, 810, 811. The beta metrics are preferably stored within the extension ALU and decoupled from the local XY memory 703.

During forward recursion updating, the alpha metrics are preferably read from XY memory. Presently, the forward recursion involving alpha metric updating is continued for purposes of illustration. Four gamma select multiplexers 804, 805, 806, 807 are coupled to receive input from the local gamma RAM 702. Each gamma select multiplexer selects one of four gamma branch metrics from the local gamma RAM 702. In the exemplary embodiment, the gamma branch metrics are packed into a data word and stored in a local memory which makes them available under software control to the Turbo QACs ALU. See Tables 1, 2, and 3 for examples of how the selection and control of the gamma metrics are performed using the four gamma select multiplexers in FIG. 8a.

A first ALU 808 performs signed fixed point arithmetic on three input variables: the output of a beta metric selector 800; the lower half of the input data operand 701 containing a first old metric value; and the output of the gamma metric selector 804. In the forward recursion the beta metric value is de-selected, and in a preferred embodiment, provides a zero value to the ALU. Although the exemplary embodiment uses signed arithmetic, alternative schemes such as saturated or modulo arithmetic could equally be used. The result of ALU 808 is output on a data bus 812. For example, in the forward state metric recursion, the output of the first ALU 808 preferably corresponds to the quantity $\log \alpha_{k-1}(m'_t)+\log \gamma_t$.

A second ALU, 809 performs signed fixed point arithmetic on three input variables: the output of beta metric selector 801; the upper half of operand1 containing a second old metric value; and the output of the gamma metric selector 805. The result of ALU 809 is output on a data bus 813. In the forward recursion, the output of the second ALU 809 preferably corresponds to $\log \alpha_{k-1}(m'_b)+\log \gamma_b$. It should be noted that if a different version of the turbo decoder algorithm is implemented in a given embodiment of the present invention, the quantities computed by the various circuits of FIG. 8a may be modified to match the forward and backward state update equations of the particular version of the decoder under consideration.

The outputs of the ALU 808 and the ALU 809 are coupled to a comparator 814 and a multiplexer 816. The comparator 814 produces a signal 815 that is used to control the multiplexer 816. The multiplexer 816 selects the output of the ALU 808 if the output of the ALU 808 is greater than the output of the ALU 809, otherwise the multiplexer selects the output of the ALU 809. As such, in the forward recursion, the output of the multiplexer 816 preferably corresponds to $\max(\log \alpha_{k-1}(m'_t)+\log \gamma_t, \log \alpha_{k-1}(m'_b)+\log \gamma_b)$.

The output of multiplexer 816 is optionally coupled to a secondary error correction ALU 817. In the exemplary embodiment the absolute difference between outputs of the ALU's 808 and 809 is calculated in the comparator 814 and is output coupled to a data bus 818. Note that in the forward recursion this absolute difference corresponds to $|\log \alpha_{k-1}(m'_t)-\log \alpha_{k-1}(m'_b)|$. The absolute difference value on bus 818 is then used as the input to an optional look up table 819. The lookup table 819 produces a correction value that is an approximation of $\log(1+e^{|\log \alpha_{k-1}(m'_t)-\log \alpha_{k-1}(m'_b)|})$ and is a second input to the error correction ALU 817. In the exemplary embodiment, the lookup table 817 computes a function as indicated in the table of FIG. 8b. This corresponds to the correction term as defined in the Michel reference. The output from ALU 817 forms a first new metric value that is packed into the results data bus 705.

The processing in the right vertical branch of the extension ALU is similar to the previously described left vertical branch. The right vertical branch computes the same forward and/or backward metric update equation as previously described and similar components in each branch perform the similar function with the same structure. The key difference is that, as illustrated in Table 3 below, the gamma select multiplexers 806 and 807 select different gamma values than the gamma select multiplexers 804 and 805. This causes, for example, the left vertical branch to compute the upper output of the butterfly operation and the right vertical branch to compute the lower output of the butterfly operation.

The control of the gamma branch metric memory 702, the gamma branch metric selection multiplexers 804, 805, 806, 807, the beta selector multiplexers 800, 801, 802, 803; is accomplished by the decoding of user programmable data bits within the instruction word. In the exemplary embodiment the user programmable data bits are short immediate (shimm) data bits available in the aforementioned instruction set. In other embodiments other user programmable control bits can be used to control the detailed operation of the TQACS ALU.

In an exemplary embodiment, bits 2, 1, 0 of the immediate data are used to control which of the four gamma branch metric ($\gamma_{00}$, $\gamma_{01}$, $\gamma_{10}$, $\gamma_{11}$) is applied to which of the four primary ALUs within the TQACS ALU. The same three bits are also used to decode which (if any) local Beta registers get written at the end of the instruction. The control bits of this exemplary embodiment are illustrated below in Table 3.

TABLE 3

| Input bits | | | Gamma byte Lane | | | | Beta write Write to local path metric regs. |
|---|---|---|---|---|---|---|---|
| bit 2 | bit 1 | Bit 0 | Alu 0 | Alu 1 | alu2 | Alu 3 | |
| 0 | 0 | 0 | $\gamma_{00}$ | $\gamma_{11}$ | $\gamma_{11}$ | $\gamma_{00}$ | B1B5 |
| 0 | 0 | 1 | $\gamma_{01}$ | $\gamma_{10}$ | $\gamma_{10}$ | $\gamma_{01}$ | B3B7 |
| 0 | 1 | 0 | $\gamma_{10}$ | $\gamma_{01}$ | $\gamma_{01}$ | $\gamma_{10}$ | B2B6 |
| 0 | 1 | 1 | $\gamma_{11}$ | $\gamma_{00}$ | $\gamma_{00}$ | $\gamma_{11}$ | B4B8 |
| 1 | 0 | 0 | $\gamma_{10}$ | $\gamma_{10}$ | $\gamma_{00}$ | $\gamma_{00}$ | |
| 1 | 0 | 1 | $\gamma_{00}$ | $\gamma_{00}$ | $\gamma_{10}$ | $\gamma_{10}$ | |
| 1 | 1 | 0 | $\gamma_{11}$ | $\gamma_{11}$ | $\gamma_{01}$ | $\gamma_{01}$ | |
| 1 | 1 | 1 | $\gamma_{01}$ | $\gamma_{01}$ | $\gamma_{11}$ | $\gamma_{11}$ | |

The exemplary embodiment preferably uses immediate data bits (bits 5 down to 3) to control which (if any) of the beta registers contained in the extension ALU are included in the addition for Lambda calculation. This control field is illustrated in Table 4 below.

TABLE 4

| Bit 5 | bit 4 | Bit 3 | alu0 | Alu 1 | Alu 2 | Alu 3 |
|---|---|---|---|---|---|---|
| 0 | 0 | 0 | 0 | 0 | 0 | 0 |
| 0 | 0 | 1 | B2 | B1 | B1 | B2 |
| 0 | 1 | 0 | B4 | B3 | B3 | B4 |
| 0 | 1 | 1 | B5 | B6 | B6 | B5 |
| 1 | — | — | B7 | B8 | B8 | B7 |

Likewise, the exemplary embodiment uses immediate data bits (bits 8 down to 6) to control the reading of gamma metrics from the gamma metric memory. This control field is illustrated in Table 5 below. Note that the exemplary embodiment serves as an example and these disclosed bit fields may be altered and combined or otherwise modified in many ways within the scope of the present invention.

TABLE 5

| Bit 8 Cnt_rst | bit 7 cnt_en | bit 6 inc_ndec | Gamma address counter action. |
|---|---|---|---|
| 1 | — | 1 | Reset gamma address counter to 0x0000 |
| 1 | — | 0 | Load gamma address counter with value in aux reg |
| 0 | 1 | 1 | Increment gamma address counter |
| 0 | 1 | 0 | Decrement gamma address counter |
| 0 | 0 | — | Gamma address counter unchanged |

The TQACS extension ALU of FIG. 8*a* is illustratively embodied as a SIMD processor where the data consists of 2 old metric data, 2 gamma metric data and optionally 2 locally held beta metrics. Within the extension ALU, two data paths calculate the updated metrics for the top and bottom paths. The TQACS extension ALU accepts up to 6 input data and produces two outputs for each clock cycle. To extend the TQACS extension ALU to a wider SIMD architecture, for example, the extension ALU could be constructed to perform 4 TQACS instructions in parallel using a wider SIMD architecture. In such an embodiment, the TQACS ALU would be capable of computing the forward or backward metric updates for a complete 3GPP symbol per cycle.

Figure 9:
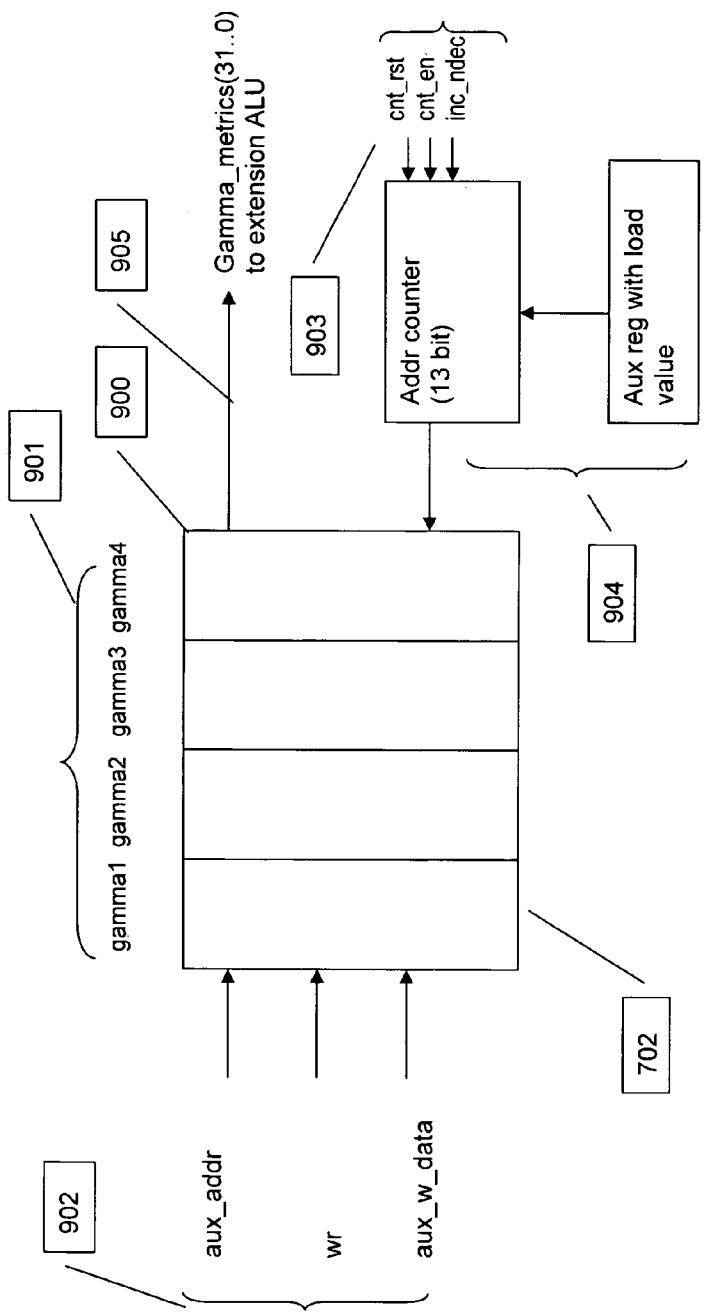
FIG. 9 is a logical block diagram providing an example of how the branch metrics (gamma's) are stored and controlled using shimm bits.

FIG. 9 shows the architecture of a device for storing and reading gamma branch metrics according to an aspect of the present invention. In the exemplary embodiment, gamma branch metrics are calculated prior to alpha or beta metric updating and are stored in a memory 900 as 8-bit packed values in a 32-bit word. In other implementations other data representations might be used. The packed gamma metrics can be viewed as occupying four byte lanes 901 of the memory 702. When storing data in the memory the microprocessor or DSP writes to the memory using an interface 902. For example, the interface 902 can be constructed using a write address bus, a write valid strobe, and a write data bus. When a valid TQACS instruction is in the microprocessor pipeline, user programmable bits 903 (e.g., shimm bits) in the TQACS instruction are decoded and coupled to control a loadable counter 904 that provides the read address for the gamma values. Since the write and read never have to occur at the same time, a single port memory can be used. The gamma branch metrics are accessed from the memory read data bus 905 that couples to the gamma multiplexers 804, 805, 806 and 807 in the TQACS extension processor. Other implementations can be constructed that pipeline the read values from the gamma metric memory.

Figure 10:
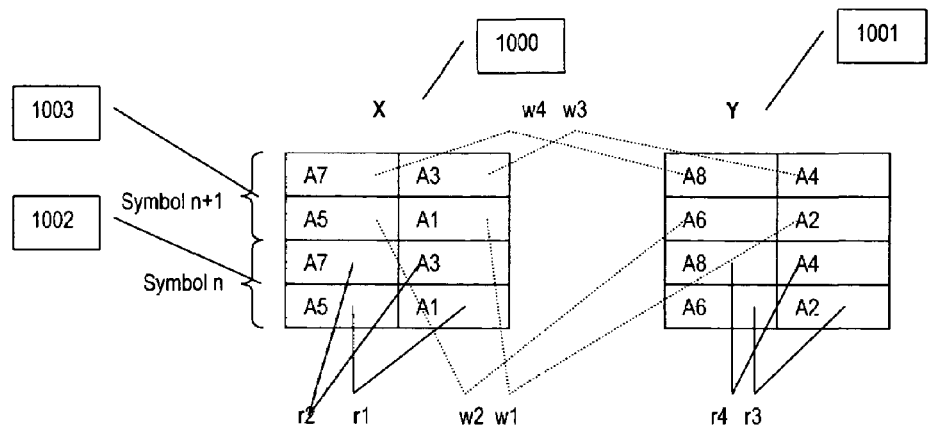
FIG. 10 illustrates an exemplary arrangement of state metrics for alpha (forward transition through the trellis).

FIG. 10 illustrates a method of storing alpha metrics in X 1000 and Y 1001 memory according to the present invention. The exemplary embodiment of TQACS performs a butterfly update of alpha metrics in a single cycle. Consequently two old metrics are to be read at the beginning of a cycle and two new metrics are to be written at the end of the cycle. Eight alpha metrics are shown for an $n^{th}$ data symbol 1002 representing the alpha metrics associated with the eight possible states in FIG. 5. These alpha metrics are denoted A1, A2, A3, A4, A5, A6, A7 and A8. Each 32-bit word of X or Y memory contains two 16-bit packed metrics. The two metrics that are packed together are chosen according to the pairs of input and output states in the butterflies of the trellis.

For example, the trellis of FIG. 5 has four butterflies with pairs of input states from the "From State" column 501. These four butterflies each have two output states in the "To State" column 502. The alpha metrics packed together in either X or Y memory are the two "From state" metrics of a butterfly. Recall from the discussion of FIG. 5, that the sets of "To States" and "From States" correspond to the following four butterfly patterns: {(m1, m5), (m1, m2)}, {(m2, m6), (m3, m4)}, {(m3, m7), (m5, m6)}, and {(m4, m8), (m7, m8)}. Note in FIG. 10 that the first read, "r1", points to A1 and A5 of the previous time step "k−1" i.e. a standard incrementing 32 bit read address mode, while the newly calculated alpha metrics are written, "w1", to A1 and A2 of the current time step "k". This corresponds to the first butterfly, {(m1, m5), (m1, m2)}. The writeback requires an addressing mode that writes back a 16-bit value to X and another 16-bit value to the same relative position in Y. This mode was added to the aforementioned ARC processor to allow efficient processing of butterflies. FIG. 10. shows the subsequent reads "rx" and writes "wx", where x is the number identifying the sequence of events. The pointers are incremented as each butterfly is processed. Note that after the first set of four reads and writes, a new set can proceed by repeating the same set of read and write operation symbol n+1 as was performed on symbol n. Now the reads are performed in symbol slot n+1 and the writes are performed into the memory locations associated with symbol n+2 (not shown). That is, the present invention defines a specialized auto incrementing mode for pointer operations that eliminates pointer overhead normally associated with software implementations of MAP based decoders.

It should be noted that a 32 bit read pointer is required for X memory bank and another 32 bit read pointer is required for Y bank. Both pointers would be set to increment (for alpha metrics) or decrement (for beta metrics) in the standard manner. The write address mode writes state outputs in such a way that the output states of a current butterfly operation are stored in the proper locations to be used as input states for subsequent butterfly operations. That is, the write addressing mode writes in advance of the read addressing mode, and the read addressing mode uses sequential interleaved addressing by incrementing a memory pointer into an interleaved memory structure.

The exemplary embodiment of FIG. 10 shows an arrangement for 4 butterflies consistent with the trellis diagram of the 3GPP cellular standard of FIG. 5. With the TQACS extension ALU as illustrated in FIG. 8a, it takes four clock cycles to complete the four butterflies of a 3GPP symbol. The TQACS extension ALU makes use of a Single Instruction Multiple Data (SIMD) architecture for the processing of multiple alpha metrics in parallel. As discussed hereinabove, the TQACS instruction can be made to work on more than one butterfly at a time by extending the data width and packing more "from metrics" and "to metrics" into the data word. This is consistent with the TQACS extension ALU's SIMD architecture and the modifications needed to extend the architecture to process more butterflies in parallel involves aggregating consecutive butterfly operations into parallel operations. Such SIMD design can be readily carried out by skilled artisans in light of the present invention.

Figure 11:
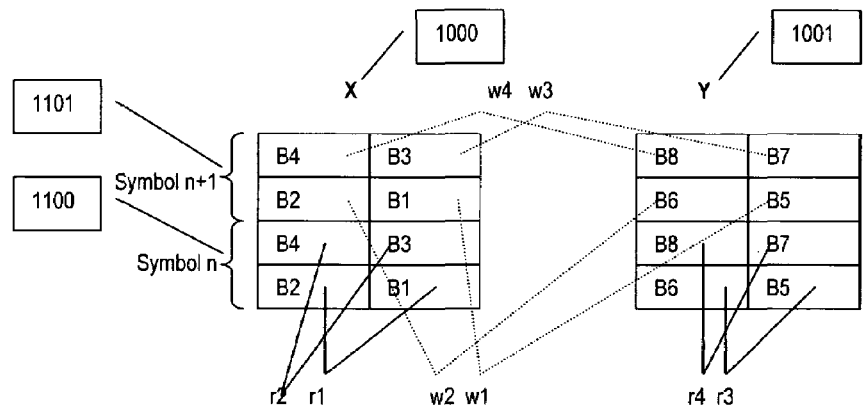
FIG. 11 illustrates an exemplary arrangement of state metrics for beta (backward transition through the trellis).

FIG. 11 illustrates the method of storing beta metrics in X 1000 and Y 1001 memory according to the invention. Since Beta metrics can be stored locally within the ALU after calculation it is possible to calculate Lamda/LLR immediately following, use the beta metrics as input to the next beta metric update and never have to store the results back to XY memory. If used in this way only the last symbol's beta metrics need storage in XY the rest are calculated, stored temporarily within the TQACS ALU and then overwritten. The exemplary embodiment of TQACS performs a butterfly update of beta metrics in a single cycle. Consequently two old metrics are to be read at the beginning of a cycle and two new metrics are to be written at the end of the cycle. Eight beta metrics are shown for an $n^{th}$ data symbol 1100 representing the beta metrics associated with the eight possible states in FIG. 5. These beta metrics are denoted B1, B2, B3, B4, B5, B6, B7 and B8. Each 32-bit word of X or Y memory contains two 16-bit packed metrics. FIG. 11 is very similar to FIG. 10, and the discussion of FIG. 10 can be applied to equally to FIG. 11 with the alpha metrics being substituted with the beta metrics. Because this FIG. 11 involves a state update in the reverse recursion, the butterfly diagram of FIG. 5 should be read with the "To State" and "From State" reversed. Hence a similar auto-incrementing mode for MAP pointer operations is defined by the present invention in the reverse direction.

Figure 12:
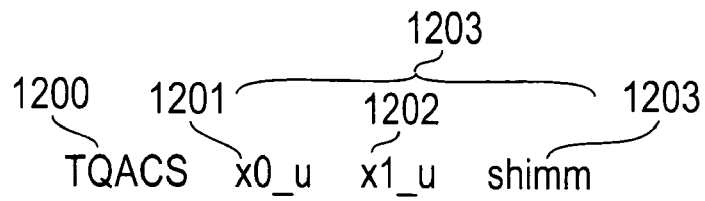
FIG. 12 illustrates an exemplary instruction format for Turbo QACS (Quad Add Compare Select).

FIG. 12 illustrates an exemplary syntax of the TQACS instruction 1200. In the exemplary embodiment, a single 32-bit input data operand is used and the TQACS ALU treats the data as two packed 16-bit values. In normal operation, during forward trellis path metric update, the data will be read from XY memory using auto incrementing address pointers as discussed in connection with FIG. 10. The TQACS instruction includes an output pointer x0_u and an input pointer x1_u 1202. The result of the TQACS instruction is normally written back to XY memory during the forward path metric update. In the example of FIG. 12 the output address pointer x0_u is used using the aforementioned special 16-bit mode that writes back 16-bit values to both X and Y memory. The exemplary instruction syntax also includes a user programmable short immediate data word (shimm bits) 1203 used as control information to the TQACS ALU. See tables 1–3 for a description of how the shimm bits control gamma selection, beta selection and gamma RAM control. The exemplary instruction format of TQACS has the advantage that it is compatible with the standard ARC Cores single operand instruction format and will also be compatible with other processor instruction sets as single operand instructions with immediate data fields are commonly available. In other implementations TQACS can be embodied as a multiple input operand instruction. That is, the x0_u, x1_u and shimm bit fields need not be packed into a single operand in alternative embodiments.

Figure 13:
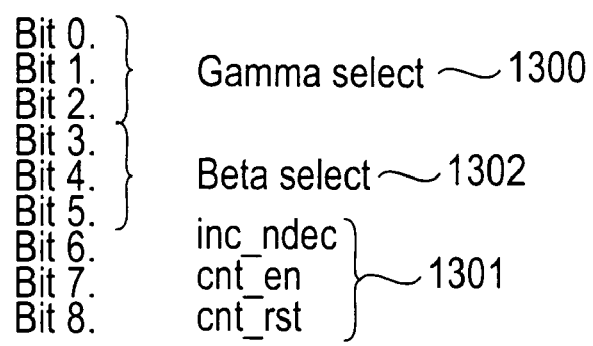
FIG. 13 illustrates an example of short immediate (shimm) data decode to control the extension ALU.

FIG. 13. Illustrates one exemplary encoding of the immediate data field 1203 used as control bits to the TQACS ALU. The immediate data field 1203 specifies the detailed operation of the TQACS instruction. In a preferred embodiment, the immediate data field 1203 includes a set of three gamma select bits 1300. The gamma select bits 1300 determine which of the packed gamma metric values are applied to which ALU and whether beta metrics should be stored to the local memory at the end of the instruction. See Table 3 above for an exemplary embodiment of how the bits may be used. Selection of beta metrics, if required, from the local beta metric memory 703 for the aforementioned LLR calculation is accomplished by decoding a further three bits 1302. See Table 4 above for an exemplary embodiment of how these bits may be used. In other implementations the control of gamma metrics and beta metrics into the TQACS ALU could equally be accomplished with other decoding of immediate data. A third data field 1301 is used to control the gamma metrics being fed into the TQACS ALU e.g. to increment the gamma address counter when all eight alpha or beta metrics have been updated at time step k. An example of how these bits may be configured for control is provided in Table 5.

Soft MAP Output—LLR

The MAP algorithm computes the probability that the source symbol $I_k$ was transmitted in the kth time slot, conditioned on the knowledge of the received distorted symbol sequence, $x_0^N = (x_0, x_1, \ldots, x_k, \ldots, x_N)$. This probability is denoted:

$$Pr\{I_k | x_0^N\}$$

The soft-output of the MAP algorithm is the log-likelihood ratio formed from these probabilities and is given by:

$$\Lambda_k = \log\left(\frac{Pr\{I_k = 1 | x_0^N\}}{Pr\{I_k = 0 | x_0^N\}}\right)$$

Knowing $\alpha_k(m)$, $\beta_{k+1}(m')$ and $\gamma_k(m,m', I_k)$ for each transition m→m', the probability of having sent the symbol $I_k$ in the $k^{th}$ symbol interval is the sum over all paths using the symbol $I_k$ in the kth symbol interval. Let $\phi(I_k)$ be the set of all transitions with symbol $I_k$, in such case we can write:

$$Pr\{I_k | x_0^N\} = \sum_{(m,m') \in \phi(I_k)} \alpha_k(m) \cdot \beta_{k+1}(m') \cdot \gamma_k(m, m', I_k)$$

This equation shows that the LLR calculation needs to combine alpha metrics, beta metrics and gamma metrics. This is efficiently achieved in the TQACS ALU since alpha metrics can be read from XY memory, beta metrics can be fed back from local memory and gammas can be fed from the gamma metric memory. In the exemplary embodiment alpha metrics are read from XY memory and received by the TQACS ALU as operand 1 and beta metrics and gamma metrics are controlled by shimm bits as previously disclosed. To use this method the beta metrics for time step 'k' are calculated, requiring 4 TQACS instructions. The beta metric update for one symbol is then followed immediately by the LLR calculation that combines the alpha, beta and gamma metrics i.e. 2 alpha metrics, 2 beta metrics and 2 gamma metrics values are combined under software control in one TQACS instruction. An important benefit of this approach is that Beta metrics do not have to be stored for the entire packet (unlike alpha metrics). Consequently this technique is very memory efficient leading to cheaper implementations. An exemplary pseudo code fragment for the LLR calculation follows:

```
For each MAP decoder
{
    For each symbol
    {
        Calculate gamma metrics & store in local RAM
    }
    For each symbol
    {
        Forward recursion using TQACS
    }
    For each symbol
    {
        Backward recursion using TQACS;
        LLR calculation using TQACS
    }
} /* End MAP decoder */
```

© Copyright 2001–2002 ARC International (UK) Limited. All rights reserved.

In the above code fragment, the TQACS operations occur in an extension ALU such as the one described in connection with FIG. 8a. An example of in-line assembly code used to implement the forward recursion is provided in FIG. 14a.

Figure 14B:
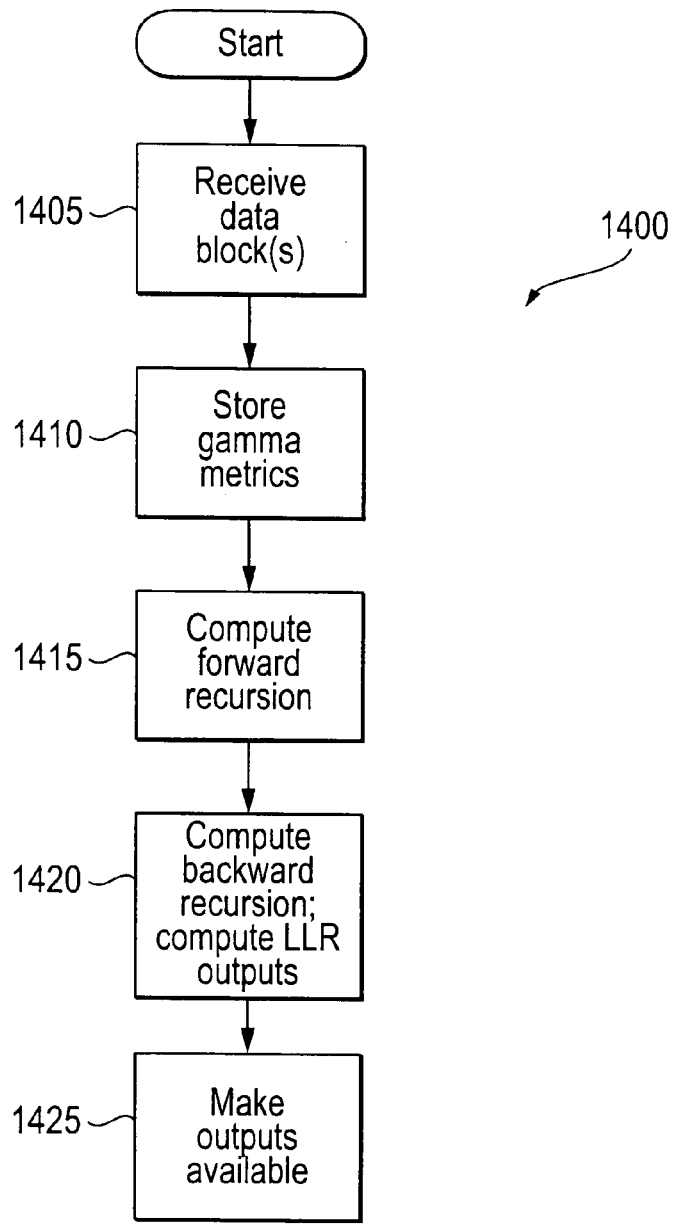
FIG. 14b is a logical flow chart illustrating an exemplary method of processing to perform MAP and similar forward-backward decoder operations using the present invention.

The MAP decoder method is illustrated in flow chart form in FIG. 14b. A method 1400 is provided to perform MAP decoding. This method serves as a step of a decoding algorithms such as a Turbo decoding (or other forms of parallel or serial concatenated decoding) algorithm. That is, for example, in FIG. 2, a decoding method according to the present invention is obtained by inserting the method 1400 into the MAP decoder blocks. When the method 1400 is inserted into the system 200, a decoder 200 method and apparatus according to the present invention results. It should be noted that when the MAP decoder method 1400 is inserted into a similar decoder such as decoder for any given parallel or serial concatenated code, a system according to the present invention results.

In a first step 1405, a block of data is received. Typically, this data initially corresponds to noisy data received from a channel. Later, the input data may be derived from the output of another MAP decoder, possibly after being processed by an interleaving operation as illustrated, for example, in FIG. 2. In a second step 1410, a set of gamma metrics are stored and are placed in a local memory such as a RAM. In a third step 1415, the forward recursion is computed. In the method 1400, this step is performed using, an extension ALU, for example the extension ALU of FIG. 8a. As previously discussed, the extension ALU of FIG. 8a may be modified to have an equivalent structure which computes a different version of the MAP algorithm, for example a version which uses a symmetric set of gamma values. All such embodiments using similar and/or equivalent structures are contemplated by the method 1400 and specifically the step 1415.

In a fourth step 1420, a backward recursion equation is computed using an extension ALU such as the extension ALU 800. For example, the backward recursion involves the beta metric update recursion as discussed in connection with FIG. 5 and FIG. 8. Also, the present invention can be used with other versions of the backward update, for example versions that use symmetric gammas, or versions adapted to other parallel or serial concatenated decoders may also be used. In such embodiments, the hardware of FIG. 8 is modified in accordance with the exact set of backward update equations used in accordance with a the decoder being embodied.

In a preferred embodiment of the method 1400, the step 1420 also includes the substep of computing the LLR output value for each symbol slot k in the block. As each beta becomes available in the backward recursion, all of the information needed to compute the LLR output value becomes available. By interleaving the backward recursion calculation and the LLR output calculations in the step 1420, the beta values need not be stored, thus providing in a savings in memory. In an alternative embodiment the step 1420 is broken into two substeps. In the first substep the betas are computed and stored. In the second substep a separate pass is made through the data block and the LLR output values are computed.

Figure 1:
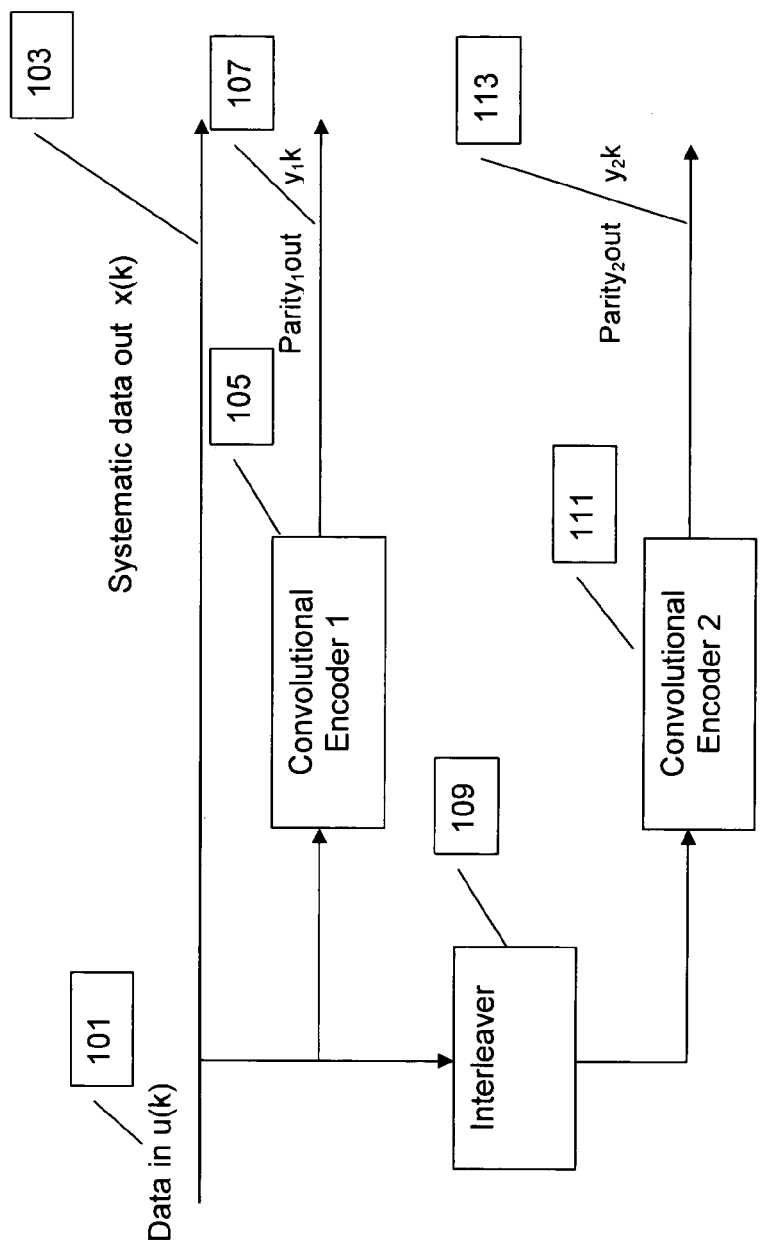
FIG. 1 is a block diagram of a typical rate ⅓ Turbo encoder.
Figure 2:
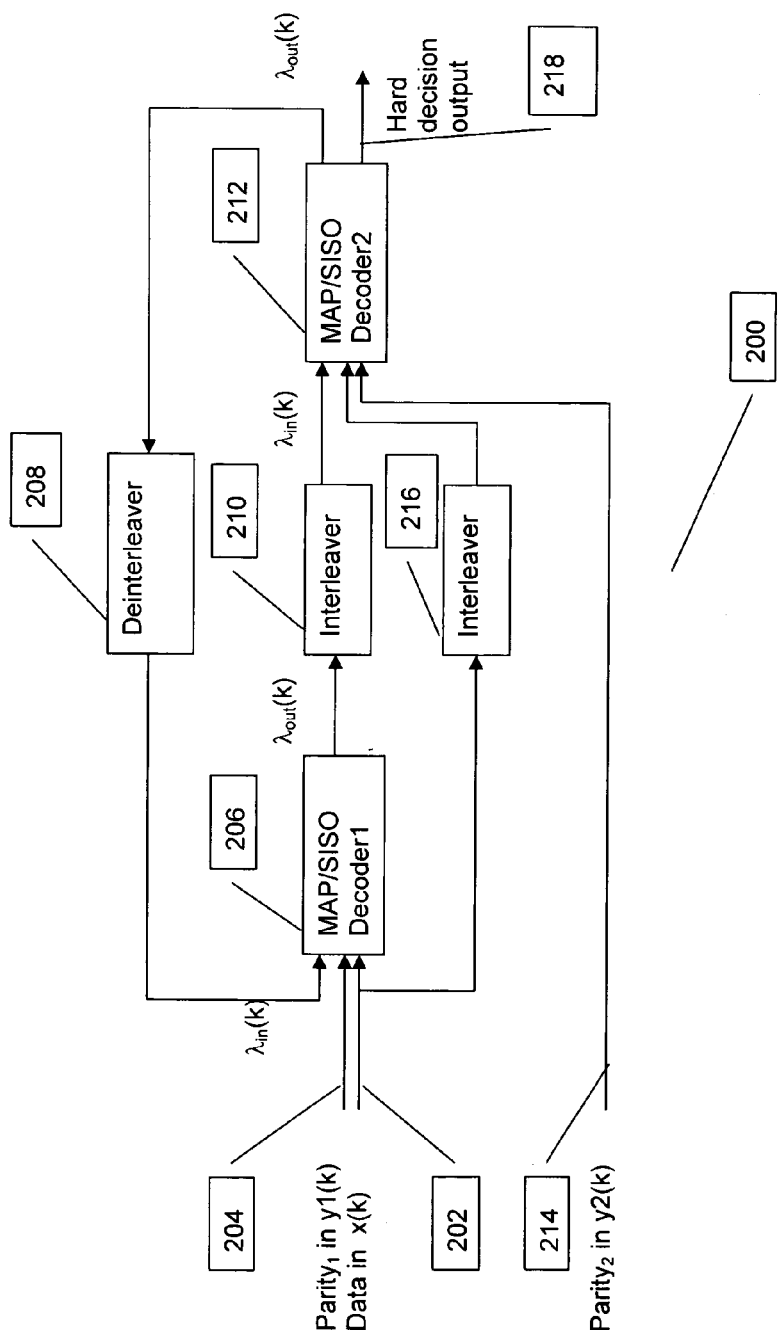
FIG. 2 is a logical flow diagram of a Turbo decoding scheme using two Soft Input, Soft Output (SISO) decoders.

Once the step 1420 is complete, control passes to a fifth set 1425 where a set of output sequences are made available. In the output step 1425 outputs such as illustrated in FIG. 2 become available. The log likelihood information can be used for subsequent iteration, or a set of iterated symbol values $I_k$ can be provided as the final output. When the method 1400 is inserted into the MAP/SISO decoder blocks of FIG. 2, FIG. 2 thus illustrates both a method and apparatus for turbo decoding in accordance with an aspect of the present invention.

Method of Generating a Processor Design

Figure 15:
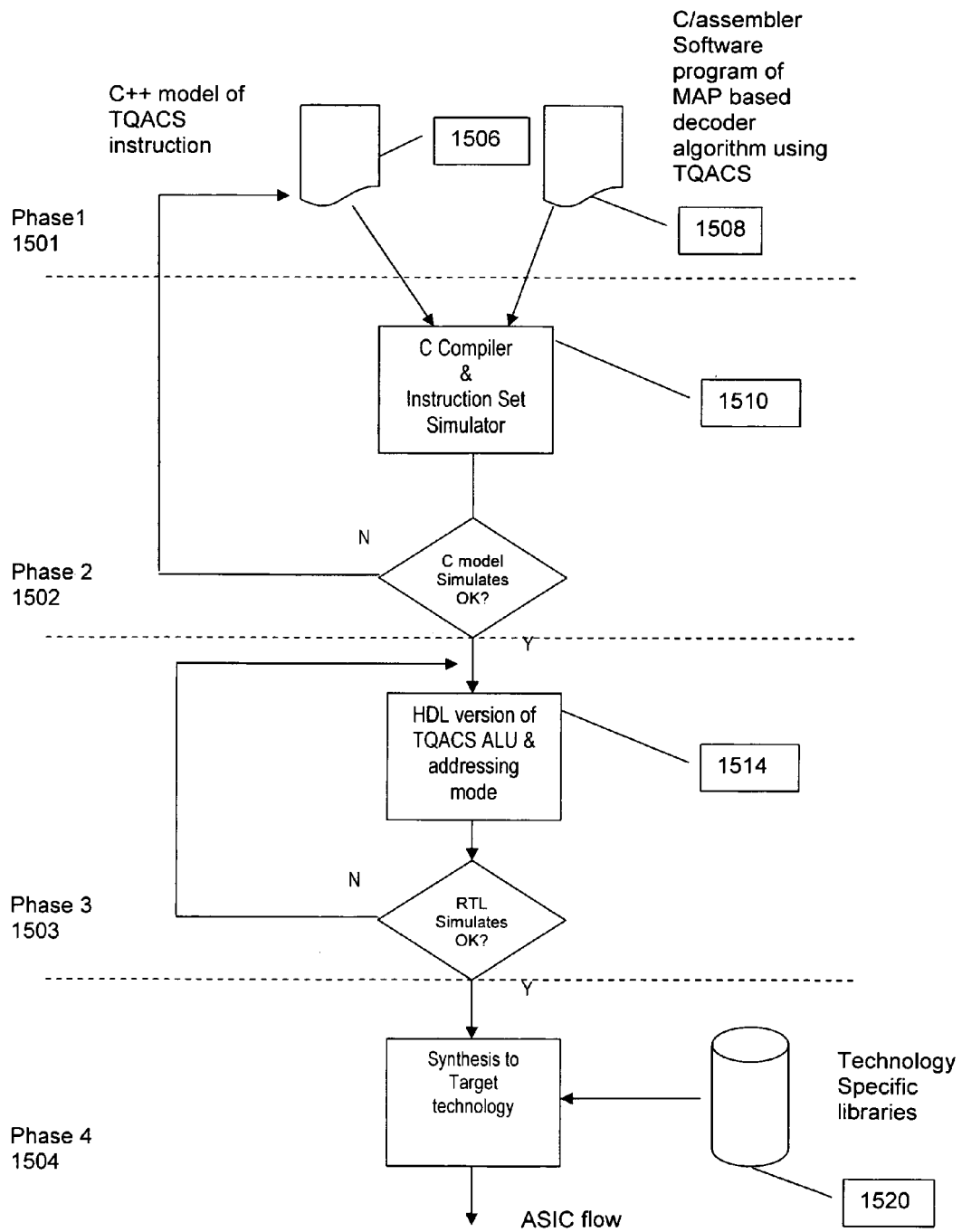
FIG. 15 is a logical flow chart illustrating an exemplary method of generating a processor design adapted for MAP and/or Turbo decoding.

Referring now to FIG. 15, a method 1500 of generating an extended digital processor design adapted for turbo decoding according to the present invention is described. It will be recognized that while the following methodology is described in terms of turbo decoding associated with the well known processing of alpha and beta metrics and the LLR calculation of the Max-Log-MAP algorithm, the invention may be more broadly applied to other types of decoding algorithms and operations.

The method 1500 of the illustrated embodiment is divided into four "phases" 1501, 1502, 1503, 1504 as shown in FIG. 15. The first phase 1501 generally comprises first defining the single operand instruction (e.g., Turbo quad add compare select or TQACS) in a high level programming language such as "C", or "C++" (step 1506). A computer program utilizing the TQACS instruction defined in step 1506 is adapted to perform a desired function such as, inter alia, Turbo decode, is also written (step 1508). In a preferred embodiment, the software program having the TQACS instruction uses the method of packing state metrics as previously described herein. Furthermore, the specialized writeback addressing mode and user-defined shimm data are preferably used to control the ALU, and provide an efficient decode routine. High level pseudocode of how the Turbo decoder is implemented in software using the present invention is provided in connection with FIG. 14. In-line assembly language using the TQACS instruction according to the present invention is also provided.

Next, in phase 2, 1502, of the exemplary method 1500, the program and the "C" (or other programming language) description are compiled (step 1510) and simulated (step 1512) using an instruction set simulator of the type well known in the computer simulation arts. For example, once the extension ALU is defined in a high level language, it can be compiled as a dynamic link library (DLL) to an instruction set simulator.

When a hardware description language (HDL) implementation of the instruction is required, the requisite hardware (e.g., see FIG. 6), associated extension registers and special addressing mode are defined in phase 3 (step 1514). This HDL is added to a host processor (e.g., DSP or RISC-DSP such as the aforementioned ARC processor produced by the Assignee hereof). The HDL is then co-simulated with the software program of phase 1 to ensure that the HDL has the same functionality as the C (or other language) model by way of comparison (step 1516). If the HDL simulations match the functionality of the C simulations, then phase 4 (step 1504) of the method 1500 is entered, and the user synthesizes a technology-specific netlist and/or description (step 1518) using a specific technology library 1520. In a preferred embodiment, the result of the synthesis using an HDL compiler according to step 1518 is a netlist that can be further processed by CAD tools to provide the files necessary to configure an integrated circuit such as a Field Programmable Gate Array (FPGA), or the input information to the semiconductor processing flow that results in the manufacture of Application Specific Integrated Circuits (ASICs) as is well known in the semiconductor arts.

Numerous modifications and adaptations of the above described embodiments and aspects of the invention will be readily apparent to a person skilled in the art of designing digital processors (such as digital signal processors and microprocessors) in view of the enclosed disclosure. It will also be recognized that while certain aspects of the invention have been described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. For example, in other embodiments the gamma branch metrics can be calculated directly, rather than pre-calculated and stored in a local memory, to save silicon area at the cost of a longer critical path and consequent reduced maximum operating frequency. In the exemplary embodiment signed 16-bit arithmetic is used, but in other embodiments other arithmetic schemes might be used such as saturating or modulo arithmetic and other bit widths. The foregoing description is of the best mode presently contemplated of carrying out the invention. This description is in no way meant to be limiting, but rather should be taken as illustrative of the general principles of the invention. The scope of the invention should be determined with reference to the claims.

We claim:

1. A method for performing a butterfly operation for implementing a decoder in a processor having a memory and arithmetic logic unit (ALU) associated therewith, comprising:

disposing old path metrics in said memory;

disposing a set of gamma metrics in a local storage device associated with said ALU;

providing at least one butterfly update instruction within the instruction set of said processor, providing said old path metrics as inputs to said ALU;

providing said set of gamma metrics as inputs to said ALU; and providing at least one addressing mode for said memory, the execution of the at least one addressing mode causing a set of new path metrics to be reordered and written back to memory subsequent to execution of said at least one butterfly update instruction.

2. The method of claim 1, whereby said act of reordering occurs in such a way that the written values can be subsequently sequentially accessed as old path metric inputs to a subsequent butterfly update instruction.

3. The method of claim 2, wherein said act of disposing old path metrics in a memory comprises disposing said metrics in an XY memory array.

4. The method of claim 3, wherein said ALU comprises an extension ALU, and said act of providing said old path metrics as inputs comprises providing said old path metrics to said extension ALU.

5. The method of claim 2, wherein said act of providing at least one butterfly update instruction comprises providing at least one MAP butterfly update (MBU) instruction.

6. The method of claim 2, whereby the XY memory comprises an X memory and a Y memory, and the at least one addressing mode further comprises:

writing at least a pair of outputs, whereby the first output is written to the X memory and the second output is written to the Y memory;

whereby the values are stored in an order such that a read pointer may be incremented or decremented to sequentially access pairs of input state values for subsequent butterfly operations from the X and then the Y memory banks.

7. The method according to claim 6, whereby at least one read pointer and one write pointer are used to index sequentially through a set of memory locations, and the addressing mode causes a pair of values to be read from selected locations in the X or the Y memory relative to said at least one pointer, and causes output values to be written to selected locations in the X and Y memories relative to said at least one pointer.

8. The method of claim 5, whereby said MBU instruction is a single operand instruction, said instruction having at least one short immediate (shimm) data field, said method further comprising:

controlling at least a portion of the operation of said ALU using at least one field of said shimm bits.

9. The method according to claim 1, further comprising:

disposing a set of beta metrics in a local storage device associated with said ALU.

10. The method according to claim 8, whereby said shimm bits at least control a gamma address counter.

11. The method according to claim 10, whereby said shimm bits at least control the selection of a set of gamma values that are used in said MAP butterfly update operation.

12. The method according to claim 8, whereby said shimm bits at least control the selection of a set of beta values that are used in said MAP butterfly update operation.

13. The method according to claim 12, whereby said shimm bits may be configured so no beta value is selected.

14. The method of claim 8, wherein said act of providing a single operand MAP-butterfly update (MBU) instruction comprises:
    defining said MBU instruction, said instruction having an instruction format, said format comprising a unique operational code (opcode);
    describing the required functionality of the MBU instruction in a hardware description language (HDL);
    simulating the MBU instruction with a host data processor;
    verifying the functionality of said HDL description; and
    synthesizing the HDL to a technology-related netlist.

15. The method of claim 14, further comprising:
    describing the required functionality of the MBU instruction in a high-level programming language; and
    simulating the MBU instruction using the high-level programming language description running on the host data processor; and
    said act of verifying involves comparing the results of the high-level programming language simulation with the results of the HDL simulation.

16. The method of claim 1, wherein the act of providing at least one addressing mode comprises describing in I-JDL said at least one addressing mode.

17. The method of claim 14, wherein said act of providing at least one address mode further comprises:
    analyzing said HDL;
    simulating said HDL with the host processor and the MBU instruction; and
    synthesizing said HDL to a technology-related netlist.

18. The method of claim 5, further comprising:
    providing a computer program comprising a set of computer instructions;
    providing in said program a first set of instructions corresponding to a forward updating pass through a MAP decoding algorithm;
    providing in said program a second set of instructions corresponding to a reverse updating pass through said MAP decoding algorithm;
    whereby at least one instruction in each of said first and second sets of instructions corresponds to said MAP-butterfly update (MBU) instruction and uses said at least one addressing mode.

19. A processor comprising:
    an ALU adapted to perform forward and reverse trellis butterfly update calculations;
    at least one instruction operative to cause said ALU to perform at least one of a forward and a reverse trellis update operation;
    a memory for storing a set of alpha metrics;
    at least one addressing mode adapted to automatically write at least a pair of alpha metrics to a permuted set of locations relative to an output address pointer, the permutation arranging said pair for subsequent sequential reading as input state values to a subsequent butterfly operation;
    local registers for storing a set of beta metrics; and
    a local memory for storing a set of gamma metrics;
    whereby when the instruction executes, the ALU selectively couples at least some of alpha, beta, and gamma values into said ALU to selectively perform one of an alpha metric update and a beta metric update.

20. The processor of claim 19, whereby when the instruction executes, the ALU selectively couples at least some of alpha, beta and gamma values into said ALU to selectively perform one of an alpha metric update, a beta metric update, and a likelihood value calculation.

21. A processor involving a memory and an extension unit that is adapted to perform forward and reverse trellis updating operations according to a version of the MAP decoder algorithm, the extension unit comprising:
    a set of control inputs, said control inputs capable of carrying information derived from the execution of a processor instruction;
    a set of input multiplexers, the input multiplexers capable of selecting a set of beta values and a set of gamma values;
    a set of at least four input ALUs operative to compute at least one of an addition and a subtraction;
    at least four state input paths operative to carry a pair of state input values from said memory to said set of at least four input ALUs;
    at least two compare-select units, each compare-select unit operative to compare the outputs of two of said ALUs and produce as output at least one of the maximum and the minimum value based upon said comparison;
    whereby said control inputs are used to cause said input multiplexers to select a set of gamma values to be arithmetically combined with at least one of the input state values and the beta values in order to compute a pair of butterfly outputs.

22. Apparatus for performing at least one arithmetic operation in a user-extensible data processor, comprising:
    a memory means for storing a sequence of metric values;
    a beta register means;
    a gamma memory means;
    a plurality of means for multiplexing, said means having inputs coupled to said memory means, said beta register means, and said gamma memory means, and at least one output;
    a plurality of arithmetic means, each of said arithmetic means receiving at least two outputs of said means for multiplexing;
    a compare select means for comparing and selecting between the outputs of at least two arithmetic means;
    wherein said memory means, beta register means, gamma memory means, means for multiplexing and arithmetic means are all control by a single operand extension instruction that causes said apparatus to selectively perform one of a forward and a reverse recursion butterfly operation.

23. A method for implementing a decoder in a user-extensible processor having a memory and arithmetic unit associated therewith, comprising:
    disposing first path metrics in said memory;
    disposing a set of gamma metrics in a storage device associated with said arithmetic unit;
    adding at least one butterfly instruction within the extension instruction set of said processor,
    providing said first path metrics as inputs to said arithmetic unit;
    providing said set of gamma metrics as inputs to said arithmetic unit; and providing at least one addressing mode for said memory, the execution of the at least one addressing mode causing a set of new path metrics to be reordered and written back to memory subsequent to execution of said at least one butterfly instruction.

24. The method of claim 23, wherein at least one of said memory and storage device are user-extensible.

25. The method of claim 23, wherein said arithmetic unit is user-extensible.

26. The method of claim 23, wherein said decoder comprises a turbo decoder.

27. The method of claim 23, wherein said decoder comprises a Viterbi decoder.

28. Digital processor apparatus having a communications decoder, comprising:
at least one processor core;
at least one arithmetic unit operatively coupled to said core, said arithmetic unit further comprising an associated storage device;
a base instruction set having a plurality of instructions adapted to run on said core;
an extension instruction set having at least one butterfly instruction;
a memory operatively coupled to said at least one core and having at least one addressing mode;
a first MAP decoder adapted to receive at least one input and generate at least one output;
a second MAP decoder operatively coupled to said first MAP decoder and adapted to generate at least one second output; and
a deinterleaver adapted to receive at least said second output and deinterleave the same;
wherein at least one of said first and second MAP decoders operates according to the method comprising:
disposing first path metrics in said memory;
disposing a set of gamma metrics in said storage device associated with said arithmetic unit;
providing said first path metrics as inputs to said arithmetic unit;
providing said set of gamma metrics as inputs to said arithmetic unit; and
executing said at least one addressing mode causing a set of new path metrics to be reordered and written back to memory subsequent to execution of said at least one butterfly instruction.

29. A method of performing a logical operation for implementing a decoder in a processor having a memory and arithmetic logic unit (ALU) associated therewith, said processor further comprising at least one logical operation update instruction within an instruction set of said processor, the method comprising:
disposing old path metrics in said memory;
disposing a set of branch metrics in a local storage device associated with said ALU;
providing said old path metrics as inputs to said ALU;
providing said set of branch metrics as inputs to said ALU; and
performing at least one addressing mode for said memory, the performance of the at least one addressing mode causing a set of new path metrics to be reordered and written back to memory subsequent to execution of said at least one logical operation update instruction.

30. The method of claim 29, wherein said logical operation comprises a butterfly operation, and said act of reordering occurs in such a way that the written values can be subsequently sequentially accessed as old path metric inputs to a subsequent butterfly update instruction.

31. The method of claim 30, wherein said act of disposing old path metrics in a memory comprises disposing said metrics in an XY memory array.

32. The method of claim 31, wherein said ALU comprises a user-selected extension ALU, and said act of providing said old path metrics as inputs comprises providing said old path metrics to said extension ALU.

33. The method of claim 30, wherein said act of providing at least one butterfly update instruction comprises providing at least one MAP butterfly update (MBU) instruction.

34. The method of claim 30, wherein the XY memory comprises an X memory and a Y memory, and the at least one addressing mode further comprises:
writing at least a pair of outputs, whereby the first output is written to the X memory and the second output is written to the Y memory;
wherein the values are stored in an order such that a read pointer may be incremented or decremented to sequentially access pairs of input state values for subsequent butterfly operations from the X and then the Y memory banks.

35. The method according to claim 34, whereby at least one read pointer and one write pointer are used to index sequentially through a set of memory locations, and the addressing mode causes a pair of values to be read from selected locations in the X or the Y memory relative to said at least one pointer, and causes output values to be written to selected locations in the X and Y memories relative to said at least one pointer.

36. The method of claim 33, whereby said MBU instruction is a single operand instruction, said instruction having at least one short immediate (shimm) data field, said method further comprising:
controlling at least a portion of the operation of said ALU using at least one field of said shimm bits.

37. The method according to claim 33, further comprising:
disposing a set of beta metrics in a local storage device associated with said ALU.

38. The method according to claim 35, whereby said shimm bits at least control a branch metric address counter.

39. The method according to claim 38, whereby said shimm bits at least control the selection of a set of gamma values that are used in said MAP butterfly update operation.

40. A processor comprising:
an ALU adapted to perform forward and reverse trellis logical update calculations;
at least one instruction operative to cause said ALU to perform at least one of a forward and a reverse trellis update operation;
a memory adapted to store a set of alpha metrics;
at least one addressing mode adapted to automatically write at least a pair of alpha metrics to a permuted set of locations relative to an output address, the permutation arranging said pair for subsequent sequential reading as input state values to a subsequent logical operation;
local registers adapted to store a set of beta metrics; and
a local memory adapted to storing a set of branch metrics;
wherein the processor is configured such that when the instruction executes, the ALU selectively couples at least some of alpha, beta, and branch values into said ALU to selectively perform one of an alpha metric update and a beta metric update.

41. The processor of claim 40, whereby when the instruction executes, the ALU selectively couples at least some of alpha, beta and branch values into said ALU to selectively perform one of an alpha metric update, a beta metric update, and a likelihood value calculation.

42. The processor of claim 40, wherein said processor comprises a user-configured and extended processor designed using a software-based design environment.

43. A processor comprising:
arithmetic logic means adapted to perform forward and reverse trellis logical update calculations;
at least one instruction operative to cause said logic means to perform at least one of a forward and a reverse trellis update operation;
a memory means for storing a set of alpha metrics;
at least one addressing mode adapted to automatically write at least a pair of alpha metrics to a permuted set of locations relative to an output address, the permutation arranging said pair for subsequent sequential reading as input state values to a subsequent logical operation;
register means adapted to store a set of beta metrics; and
a local memory adapted to storing a set of branch metrics;
wherein the processor is configured such that when the instruction executes, the logic means selectively couples at least some of alpha, beta, and branch values into said logic means to selectively perform one of an alpha metric update and a beta metric update.

* * * * *